(12) United States Patent
Sasaki et al.

(10) Patent No.: US 7,091,890 B1
(45) Date of Patent: Aug. 15, 2006

(54) MULTI-PURPOSE SOURCE SYNCHRONOUS INTERFACE CIRCUITRY

(75) Inventors: Paul T. Sasaki, Sunnyvale, CA (US); Jason R. Bergendahl, Sunnyvale, CA (US); Atul Ghia, San Jose, CA (US); Hassan Bazargan, San Jose, CA (US); Ketan Sodha, Fremont, CA (US); Jian Tan, Fremont, CA (US); Qi Zhang, Milpitas, CA (US); Suresh Menon, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/919,901

(22) Filed: Aug. 17, 2004

(51) Int. Cl.
*H03M 9/00* (2006.01)
(52) U.S. Cl. ........................ 341/100; 341/59
(58) Field of Classification Search ............... 341/100, 341/101, 59; 375/222; 701/107
See application file for complete search history.

(56) References Cited

U.S. PATENT DOCUMENTS

| | | | | |
|---|---|---|---|---|
| 4,688,016 A * | 8/1987 | Fok | ............... | 341/59 |
| 5,038,365 A * | 8/1991 | Belloc et al. | ............... | 375/222 |
| 6,459,393 B1 * | 10/2002 | Nordman | .................... | 341/100 |
| 6,542,096 B1 * | 4/2003 | Chan et al. | .................. | 341/100 |
| 6,671,787 B1 * | 12/2003 | Kanda et al. | ............... | 711/167 |
| 6,707,399 B1 * | 3/2004 | Wang et al. | ................. | 341/100 |
| 2003/0193894 A1 * | 10/2003 | Tucker et al. | | |
| 2004/0243899 A1 * | 12/2004 | Bonneau et al. | | |

OTHER PUBLICATIONS

U.S. Appl. No. 10/889,553, filed Jul. 12, 2004, Zhang et al.
U.S. Appl. No. 10/889,248, filed Jul. 12, 2004, Zhang et al.
U.S. Appl. No. 10/919,766, filed Aug. 17, 2004, Sasaki et al.
U.S. Appl. No. 10/919,900, filed Aug. 17, 2004, Sasaki et al.
Altera, Corp., "QDR SRAM Controller Reference Design for Stratix and Stratix GS Devices", Application Note 211, Nov. 2002, pp. 1-30, v. 2.0, available from Altera Corporation, 2610 Orchard Parkway, San Jose, California 95134-2020.
Altera, Corp., "The Benefits of Altera's High-Speed DDR SDRAM memory Interface Solution", White Paper, May 2004, pp. 1-16, v. 1.1 available from Altera Corporation, 2610 Orchard Parkway, San Jose, California 95134-2020.
Altera, Corp., "DDR SDRAM Controller MegaCore Function User Guide", Feb. 2003, pp. 1-89, Core Version 1.1.0, Document Version 1.1.0 rev 1, available from Altera Corporation, 2610 Orchard Parkway, San Jose, California 95134-2020.
Altera, Corp., "Using High-Speed Differential I/O Interfaces in Stratix Devices", Application Note 202, Jan. 2003, pp. 1-72, v. 2.1, available from Altera Corporation, 2610 Orchard Parkway, San Jose, California 95134-2020.

(Continued)

*Primary Examiner*—Jean Bruner Jeanglaude
(74) *Attorney, Agent, or Firm*—W. Eric Webostad; Justin Liu

(57) ABSTRACT

A serializer-deserializer instantiated in configurable logic of an integrated circuit is described. The serializer-deserializer includes an input deserializer and an output serializer, which may be commonly coupled via an input/output pad. Each of the serializer and deserializer may be configured for an operating mode selected from a Single Data Rate mode and a Double Data Rate mode. The serializer-deserializer may be used as part of a synchronous interface.

26 Claims, 15 Drawing Sheets

OTHER PUBLICATIONS

Altera, Corp., "Using Source-Synchronous Signaling with DPA in Stratix GX Devices", Application Note 236, Nov. 2002, pp. 1-18, v. 1.0, available from Altera Corporation, 2610 Orchard Parkway, San Jose, California 95134-2020.

Altera, Corp., "Section 1. Device Pine Information", Jul. 2003, Ch. 1-7, pp. 1-1 to 7-84, v. 2.0, available from Altera Corporation, 2610 Orchard Parkway, San Jose, California 95134-2020.

Altera, Corp., "Section II. Memory", Apr. 2004, Ch. 2-3, pp. II-1 to 3-28, v. 3.0, available from Altera Corporation, 2610 Orchard Parkway, San Jose, California 95134-2020.

Altera, Corp., "Section III. I/O Standards", Apr. 2004, Ch. 4-5, pp. III-1 to 5-76, v. 3.0, available from Altera Corporation, 2610 Orchard Parkway, San Jose, California 95134-2020.

Altera, Corp., "Section VI. Configuration & Remote System Upgrades", Apr. 2004, Ch. 11-12, pp. VI-1 to 12-44, available from Altera Corporation, 2610 Orchard Parkway, San Jose, California 95134-2020.

Altera, Corp., "2. TriMatrix Embedded Memory Blocks in Stratix & Stratix GX Devices", Apr. 2004, pp. 2-1 to 2-28, v. 3.0, available from Altera Corporation, 2610 Orchard Parkway, San Jose, California 95134-2020.

Altera, Corp., "3. External Memory Interfaces", Apr. 2004, pp. 3-1 to 3-28, v. 3.0, available from Altera Corporation, 2610 Orchard Parkway, San Jose, California 95134-2020.

Altera, Corp., "4. Selectable I/O Standards in Stratix & Stratix GX Devices", Apr. 2004, pp. 4-1 to 4-42, vol. 2, v. 3.0, available from Altera Corporation, 2610 Orchard Parkway, San Jose, California 95134-2020.

Altera, Corp., "5. High-Speed Differential I/O Interfaces in Stratix Devices", Apr. 2004, pp. 5-1 to 5-76, vol. 2, v. 3.0, available from Altera Corporation, 2610 Orchard Parkway, San Jose, California 95134-2020.

Altera, Corp., "Section I. Clock Management", Apr. 2004, pp. 1-1 to 1-58, vol. 2, v. 3.0, available from Altera Corporation, 2610 Orchard Parkway, San Jose, California 95134-2020.

Altera, Corp., "Section I. Stratix Device Family Data Sheet", Apr. 2004, Ch. 1-5, pp. 1-1 to 5-2, vol. 1, available from Altera Corporation, 2610 Orchard Parkway, San Jose, California 95134-2020.

Altera, Corp., "Section II. PCB Layout Guidelines", Apr. 2003, Ch. 8-10, pp. II-1 to 10-58, vol. 1, available from Altera Corporation, 2610 Orchard Parkway, San Jose, California 95134-2020.

* cited by examiner

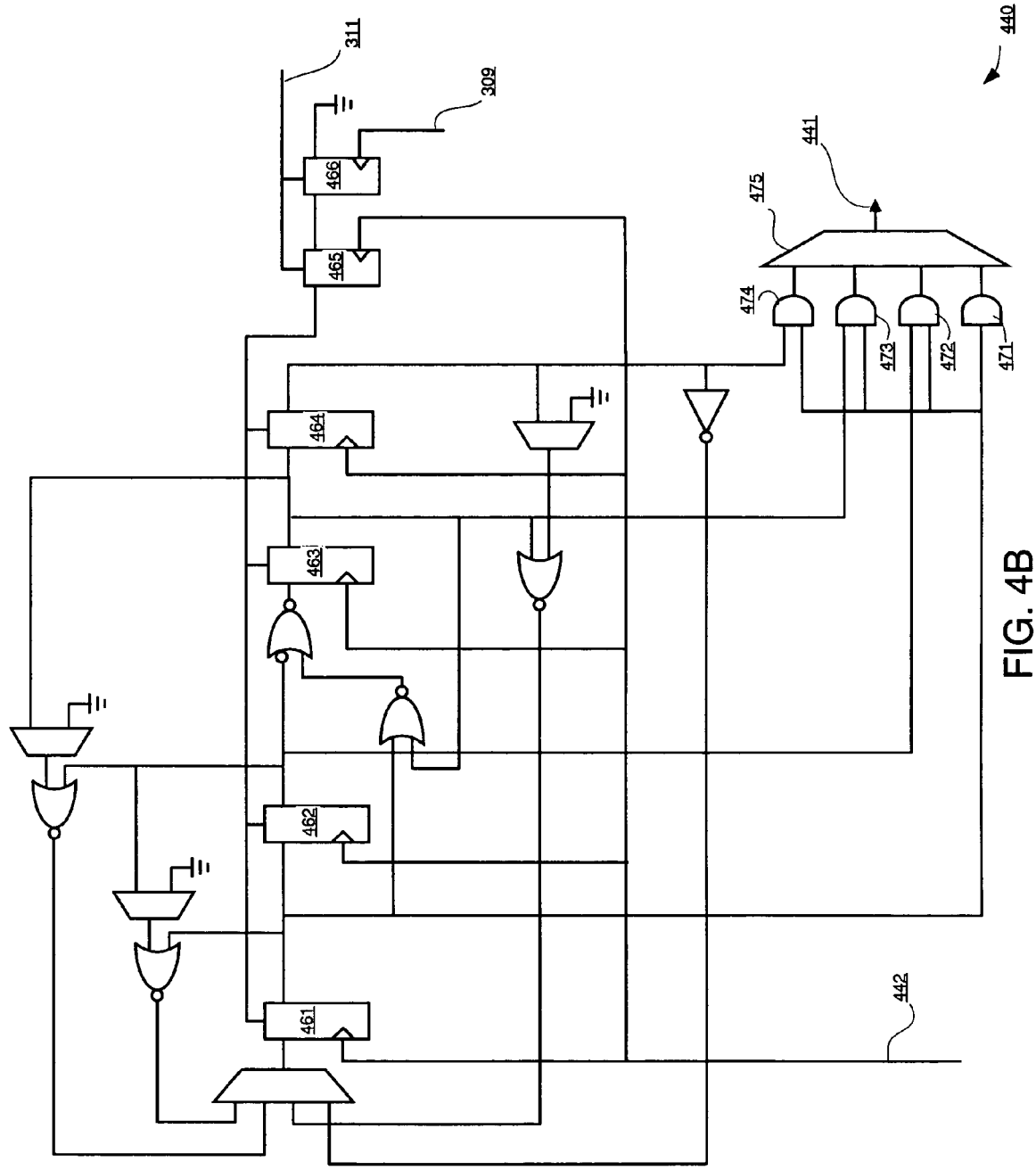

MULTI-PURPOSE SOURCE SYNCHRONOUS INTERFACE CIRCUITRY

FIELD OF THE INVENTION

One or more aspects of the invention relate generally to a source synchronous interface and more particularly to a multi-purpose source synchronous interface.

BACKGROUND OF THE INVENTION

Digital communication of information from a source to a receiver may be done source synchronously. Source synchronous communication involves a clock signal from the source ("forwarded clock signal") being sent in parallel with other information from the source. Such other information may include data or control information, where control information includes address information.

There are different types of source synchronous communication, which may depend on the application. For example, in source synchronous communication between integrated circuits, frequency of the source clock signal from a source integrated circuit may be known a priori by a receiving integrated circuit. An example of this type of source synchronous interface may be found in communication with synchronous memory, where a data or source clock signal is sent in parallel with data/control information.

However, for example, in source synchronous communication in networking or telecommunication, such as between a transmitting device and a receiving device, frequency of a source clock signal may not be known by the receiving device. Furthermore, due to differences in signal propagation delays, there may be skew between information communicated in parallel with the source clock signal. For example, data on one channel may be askew from data on another channel.

Accordingly, programmable logic devices ("PLDs"), to provide multi-purpose use, have been made with two separate source synchronous interfaces. A Field Programmable Gate Array ("FPGA") is one type of PLD where two or more different types of source synchronous interfaces may be co-located on an integrated circuit. An FPGA typically includes an array of configurable logic blocks ("CLBs"), programmable input/output blocks ("IOBs") and other programmable resources. The CLBs and IOBs are interconnected by a programmable interconnect structure. The CLBs, IOBs, and interconnect structure are typically programmed by loading a stream of configuration data ("bitstream") into internal configuration memory cells that define how the CLBs, IOBs, and interconnect structure are configured.

In conventional FPGAs having two different source synchronous interfaces for example, one interface is for local integrated circuit-to-integrated circuit communication, such as between a memory and an FPGA, and another interface is for more remote communication, such as an FPGA used for computer network or telecommunication network communication. Moreover, separate source synchronous interfaces for different applications may be formed in processors, Application Specific Integrated Circuits and Application Specific Standard Products, among other integrated circuits, and is not limited to PLDs. However, having at least two separate interfaces for different source synchronous applications increases pin count, as well as consumes significant semiconductor die area.

Accordingly, it would be desirable and useful to provide a multi-purpose source synchronous interface that may be used for either as a memory or a networking source synchronous interface.

SUMMARY OF THE INVENTION

An aspect of the invention is a data deserializer instantiated in configurable logic of an integrated circuit, comprising: an input deserializer instantiated in the configurable logic, the input deserializer including a data interface to programmable circuitry of the programmable logic device; the input deserializer configured to receive serial data via the data interface and to convert the serial data to parallel data; the input deserializer configurable to operate in a selected one of a Single Data Rate mode and a Double Data Rate mode; and the input deserializer configured with a single serial chain of registers in an input stage to convert the serial data to the parallel data in the Single Data Rate mode and configured with two serial chains of registers in the input stage to convert the serial data to the parallel data in the Double Data Rate mode.

Another aspect of the invention is a data serializer instantiated in configurable logic of an integrated circuit, comprising: an output serializer instantiated in the configurable logic, the output serializer including a data interface to programmable circuitry of the programmable logic device; the output serializer configured to receive parallel data via the data interface and to convert the parallel data to serial data; the output serializer configurable to operate in a selected one of a Single Data Rate mode and a Double Data Rate mode; and the output serializer configured with a single serial chain of registers in an input stage to convert the parallel data to the serial data in the Single Data Rate mode and configured with two serial chains of registers in the input stage to convert the parallel data to the serial data in the Double Data Rate mode.

Yet another aspect of the invention is a serializer-deserializer instantiated in configurable logic of an integrated circuit, comprising: an output serializer-deserializer portion instantiated in a portion of the configurable logic, the output serializer-deserializer portion including a first data port; an input serializer-deserializer portion instantiated in another portion of the configurable logic, the input serializer-deserializer portion including a second data port; an input/output pad coupled to the output serializer-deserializer portion via an output buffer and coupled to the input serializer-deserializer portion; the output serializer-deserializer portion configured to receive first parallel data via the first data port, to convert the first parallel data to first serial data and to output via the output buffer and the input/output pad the first serial data; and the input serializer-deserializer portion configured to receive second serial data via the input/output pad, to convert the second serial data to second parallel data and to output via the second data port the second parallel data.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 4B is a schematic diagram depicting an exemplary embodiment of a programmable load generator.

DETAILED DESCRIPTION OF THE DRAWINGS

Figure 1:
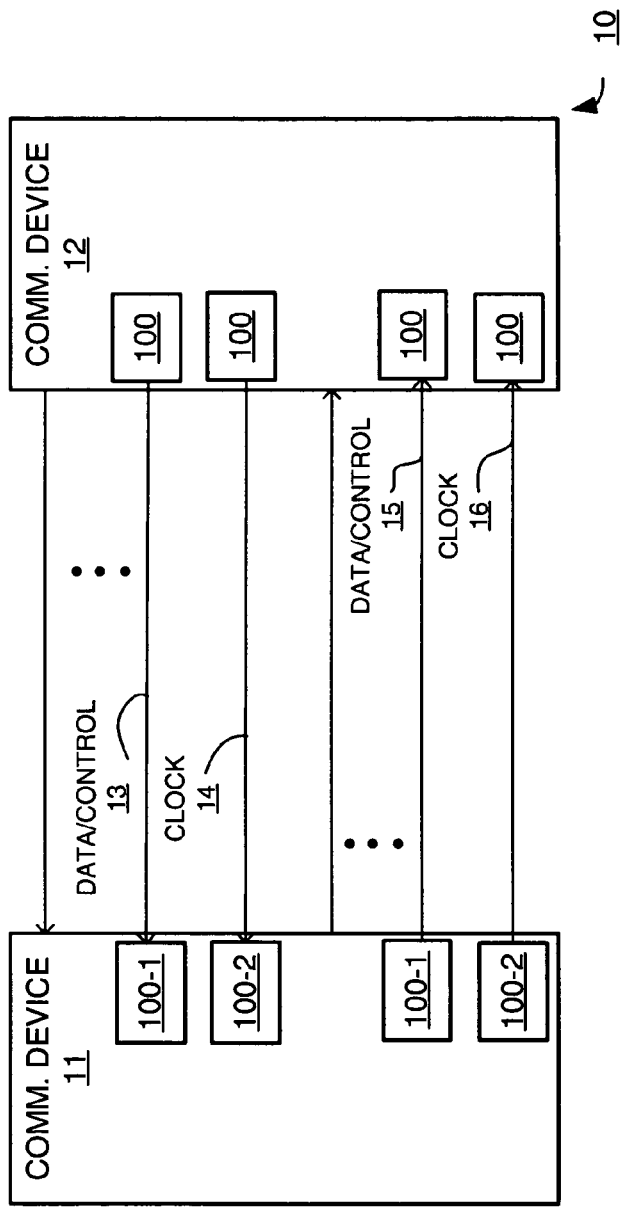
FIG. 1 is a high-level block diagram depicting an exemplary embodiment of a source synchronous interface.

FIG. 1 is a high-level block diagram depicting an exemplary embodiment of a source synchronous interface 10. Interface 10 includes communication device 11 and communication device 12. Notably, a communication device as used herein may be any of a variety of integrated circuits. Thus, for example, communication device 12 may be a synchronous memory integrated circuit. Moreover, communication device as used herein may be a networking/telecommunication device. Thus, for example, communication device 12 may be a router. Each communication device 11 and 12 may include a respective serializer-deserializer ("SERDES") 100 for each incoming and outgoing signal. However, as will become more apparent, each SERDES 100 may be coupled to a buffer that may be tri-stated subject to the control of SERDES 100 to provide bi-directionality through a single input/output pad. Thus, for example, one SERDES 100-1 may be used for incoming and outgoing data and another SERDES 100-2 may be used for incoming and outgoing clockage. Furthermore, with respect to SERDES 100, there is no distinction between data and clock, so a SERDES 100 may be used for data in one instance and clock in another instance. Of course, knowing when data is to be sent or received will be dependent upon the protocol between communication devices 11 and 12. There are many various forms of known communication protocols including either or both in-band and out-of-band signaling.

Information, such as data and control information, 13 is sent along with a clock signal 14 from communication device 12 to communication device 11. Information, such as data and control information, 15 is sent in along with a clock signal 16 from communication device 11 to communication device 12. Notably, data/control information on signals 13 and 15 is serial, though multiple serial data/control information signals 13 and 15 may be provided with clock signal 14 and 16, respectively, as in parallel busing or parallel transmission. However, for purposes of clarity, only one serial transmission of information is described as it will be apparent that multiple serial transmissions may be used from the example of one serial transmission.

A clock signal 14 or 16 is conventionally referred to as a "forwarded clock." Data/control information 13 is sent by communication device 12 with a timing relationship to forwarded clock 14, and data/control information 15 is sent by communication device 11 with a timing relationship to forwarded clock 16. Communication device 12 receiving signals 15 and 16 aligns data/control information on signal 15 to one or more edges of clock signal 16. Likewise, communication device 11 receiving signals 13 and 14 aligns data/control information on signal 13 to one or more edges of clock signal 14. Data/control lines 13 and 15 and clock lines 14 and 16 are for uni-directional signals. Alternatively, for bi-directional signaling, data/control lines 13 and 15 may be a single line and clock lines 14 and 16 may be a single line.

Notably, for Single Data Rate ("SDR") transmissions, only one edge, either rising ("positive") or falling ("negative"), of a clock signal is used. However, for Double Data Rate ("DDR") transmissions, both rising and falling edges of a clock signal are used. As will become more apparent, SERDES 100 may be configured for either SDR or DDR.

Figure 2:
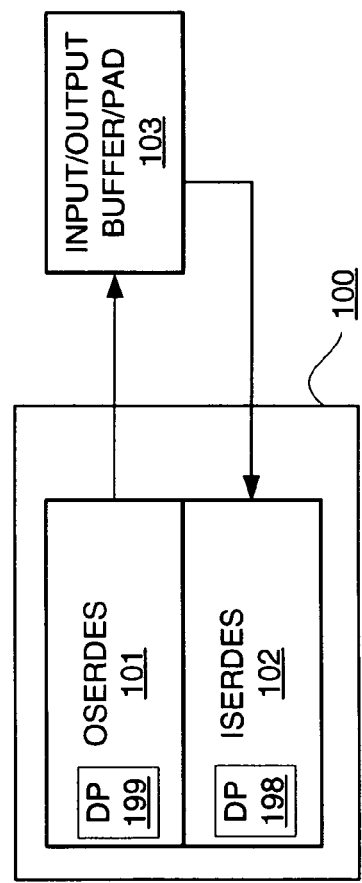
FIG. 2 is a block diagram depicting an exemplary embodiment of a SERDES.

FIG. 2 is a block diagram depicting an exemplary embodiment of a SERDES 100. SERDES 100 includes an output SERDES ("OSERDES") 101 and an input SERDES ("ISERDES") 102. OSERDES 101 and ISERDES 102 are commonly coupled to an input/output ("IO") buffer/pad 103. Notably, SERDES 100 may be used either for a networking/telecommunication interface or a memory interface. Though SERDES 100 is dual purpose, SERDES 100 is configured for one of these two types of communication at a time. However, any of a variety of input/output schemes, such as TTL, CMOS, HSTL, SSTL and LVDS, among others, may be used. Notably, single-ended or differential signaling may be used. If differential signaling is used, two input/output pads are used to provide a differential pair.

SERDES 100 components of an integrated circuit may all be independent of each other. Moreover, two or more SERDES 100 may be merged together to form wider interfaces. Thus, it should be appreciated that a SERDES 100 may function as part of a group or used as an independent element.

SERDES 100 is in contrast to having one section of an integrated circuit devoted to memory interfacing and having another section of an integrated circuit devoted to network/telecommunication interfacing. One or more IO cells used to provide SERDES 100 include programmable elements. These IO cells are known in the field of FPGAs, and may also be used in other integrated circuits. These programmable elements are configured to configure SERDES 100 either for memory interfacing or network/telecommunication interfacing. This configurability allows for one or more SERDES 100 to be programmed into programmable IO cells of an integrated circuit in contrast to pin specific interfaces of the prior art. Notably, programmable IO cells may be located in integrated circuits other than programmable logic devices, including without limitation processors, ASICs and ASSPs. Notably, programmable IO cells are not to be confused with input/output buffers.

For information provided as input to buffer/pad 103, such serial information is deserialized by ISERDES 102, for example converted to parallel data. For information output from buffer/pad 103, such information is received by OSERDES 101 in parallel and converted to a serial information stream by OSERDES 101 for output via buffer/pad 103. Additionally, another IO pad for a source synchronous interface is used for receiving or providing a clock signal. Notably, each IO pad, and thus each externally accessible connector to IO pad, may be used for data/control information or a clock. This is because a clock signal travels the same path as data/control information in SERDES 100, which facilitates clock edge alignment with data/control information. Accordingly, each ISERDES and OSERDES may be in a same configuration whether used for data or for clock.

With simultaneous reference to FIGS. 1 and 2, for a single differential serial stream of data/control information ("data") in one direction such as data signal 13 and another single differential serial stream of data in another direction such as data signal 15, there may be four IO pads used by each communication device 11 and 12. Alternatively, there may be two IO pads used by each communication device 11 and 12 within a protocol for providing a priori information of when data is to be communicated for bi-directional traffic on a single pair of lines for differential communication. For purposes of clarity by way of example and not limitation, it is assumed that communication devices 11 and 12 are respective FPGA integrated circuits. Also, single-ended serial streams may also be used in accordance with the present invention.

OSERDES 101 includes a data port ("DP") 199 for obtaining data from a host integrated circuit device, such as programmable circuitry ("fabric") of an FPGA. ISERDES 102 includes a data port ("DP") 198, including without limitation a control port, for communicating data to a host integrated circuit device, such as fabric of an FPGA.

Figure 3:
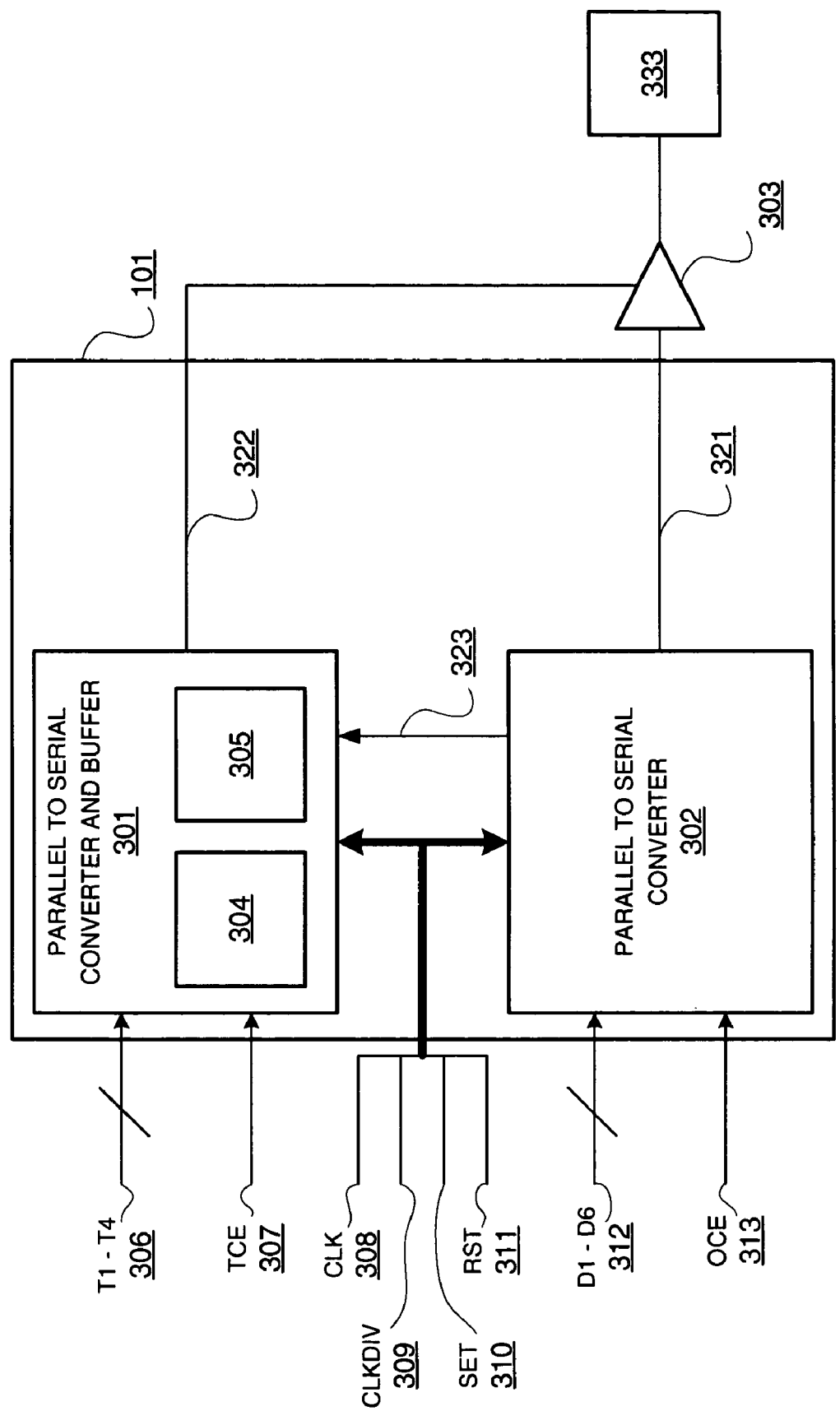
FIG. 3 is a block/schematic diagram depicting an exemplary embodiment of an OSERDES.

FIG. 3 is a block/schematic diagram depicting an exemplary embodiment of an OSERDES 101. OSERDES 101 includes parallel to serial converter and buffer block 301 and parallel to serial converter 302. For purposes of clarity by way of example, bit values are described below although other bit values may be used. In this embodiment, IO buffer/pad 103 of FIG. 2 is output buffer 303 and pad 333. Other details regarding OSERDES 101 are described below for example with reference to FIG. 3.

Four tri-state control signals, namely, T1 through T4, 306 are input to parallel to serial converter and buffer block 301, and data signal, namely, D1 through D6, inputs 312 are input to parallel to serial converter 302. Having four tri-state control signals or six data signals is merely an example, as other values may be used. Moreover, not all signals need be used, and reprogrammable elements facilitate reducing or increasing the number of circuit elements used depending on application. Additionally, because reprogrammable elements are used, SERDES 100 may be completely removed thus facilitating reversion back to an FPGA starting form. Notably, parallel to serial converter and buffer block respectively includes parallel to serial converter 304 and buffer 305. Buffer 305 in this embodiment includes both combinatorial and register circuitry.

It should be understood that data may be transmitted on a serial side, such as from output buffer 303, at a frequency greater than the frequency of operation of on a parallel input side, such as the frequency data 312 is clocked into parallel to serial converter 302 or tri-state data 306 is clocked into parallel to serial converter 304. Thus, such parallel side input data may have to be divided up for processing at a slower frequency than the frequency of transmission. It should be understood that by dividing a serial stream into parallel streams of data a slower frequency for processing may be used thereby reducing the design and formation complexities associated with higher-frequency devices. Accordingly, for a wider parallel interface, data signals, such as tri-state control signals 306 and data signals 312, may have to be correspondingly increased in number.

Width of data is controlled in relation to frequency of transmission. For example, for a fixed frequency of operation of FPGA 11 of FIG. 1, a higher frequency of transmission means having to process more data bits in parallel, and a lower frequency of transmission means having to process fewer data bits in parallel. Moreover, the frequency of transmission may be fixed and frequency of operation of IO cells of FPGA 11 may be adjustable, in which embodiment parallel data input width for parallel to serial conversion may be adjusted.

It should be understood that for a bi-directional communication interface, buffer 303 is tri-stated responsive to tri-state serial output signal 322 when SERDES 101 is to receive either a clock or data from an external source via pad 333. However, for a uni-directional communication interface for output-only traffic, buffer 303 need not be tri-stated for OSERDES 101, and thus parallel-to-serial converter and buffer 301 is not used as no tri-state signal(s) need be generated.

For example, parallel data 312 is converted to serial data 321 by parallel-to-serial converter 302. Serial data 321 is input to output buffer 303. Parallel tri-state control data 306 is converted to serial tri-state control data 322 by parallel to serial converter 304 for tri-state control of output buffer 303. Accordingly, output buffer 303 outputs or does not output serial data 321 to IO pad 333 depending upon serial control data 322. Programmable tri-state control facilitates having one interface capable of handling high-speed memory bi-directional communication and high-speed uni-directional, such as low voltage differential signaling (LVDS), communication for networking/telecommunications applications.

Clock signal 308, clock divided signal 309, set signal 310 and reset signal 311 are each provided to parallel to serial converter and buffer block 301 and to parallel to serial converter 302. Clock divided signal 309 is a divided down version of clock signal 308. Thus, clock divided signal 309 has a lower frequency than clock signal 308. Clock divided signal 309 is used for clocking in tri-state control data 306 into parallel to serial converter 304 and for clocking in data 312 into parallel to serial converter 302. Output of parallel to serial converters 302 and 304 is clocked out responsive to clock signal 308. Thus, information in parallel may be clocked in at a slower frequency than the frequency at which it is clocked out in serial.

Tri-state clock enable ("TCE") signal 307 is provided to parallel to serial converter and buffer block 301. Responsive to TCE signal 307 being asserted, i.e., driven to an active state, control data 322 is clocked out of parallel to serial converter 304, and responsive to TCE signal 307 being deasserted, i.e., driven to an inactive state, control data 322 is not clocked out of parallel to serial converter 304.

Output clock enable ("OCE") signal 313 is provided to parallel to serial converter 302. Responsive to OCE signal 313 being asserted, data 321 is clocked out of parallel to serial converter 302, and responsive to OCE signal 313 being deasserted, data 321 is not clocked out of parallel to serial converter 313.

In an embodiment, to provide for SDR and DDR, parallel to serial converter 301 or 302 or both may be a 4-bit DDR converter. Additionally, buffer 305 may buffer 2 bits for DDR and one bit for SDR. Tri-state serial output 322 may be generated from 1, 2 and 4 bit widths of tri-state input 306, and parallel to serial converter 302 may be a 2-bit to 6-bit converter for input widths of 2, 3, 4, 5 and 6 bits from data input 312. Accordingly, it should be appreciated that serial data output to and serial control of buffer 303 may be for SDR or DDR for an SDR or DDR output, respectively, from pad 333. Furthermore, buffer 305 may be a used as combinatorial circuitry.

It may be desirable to increase data bit width. Moreover, differential signaling uses two terminals, one designated as a positive voltage terminal and another designated as a negative voltage terminal, as is known. However, an OSERDES may be combined with another OSERDES to provide a wider input data width, while facilitating differential signaling. Furthermore, OSERDES may be combined for single-ended signaling. However, because the combination of two or more OSERDES means an additional pad 333 is available, differential signaling may be accommodated with the additional pad obtained due to the combination of OSERDES with no additional cost. Shift in and shift out ports for combining OSERDES are described below. Notably, there may be a programmable load line 323 from parallel to serial converter 302 to parallel to serial converter 301.

Figure 4:
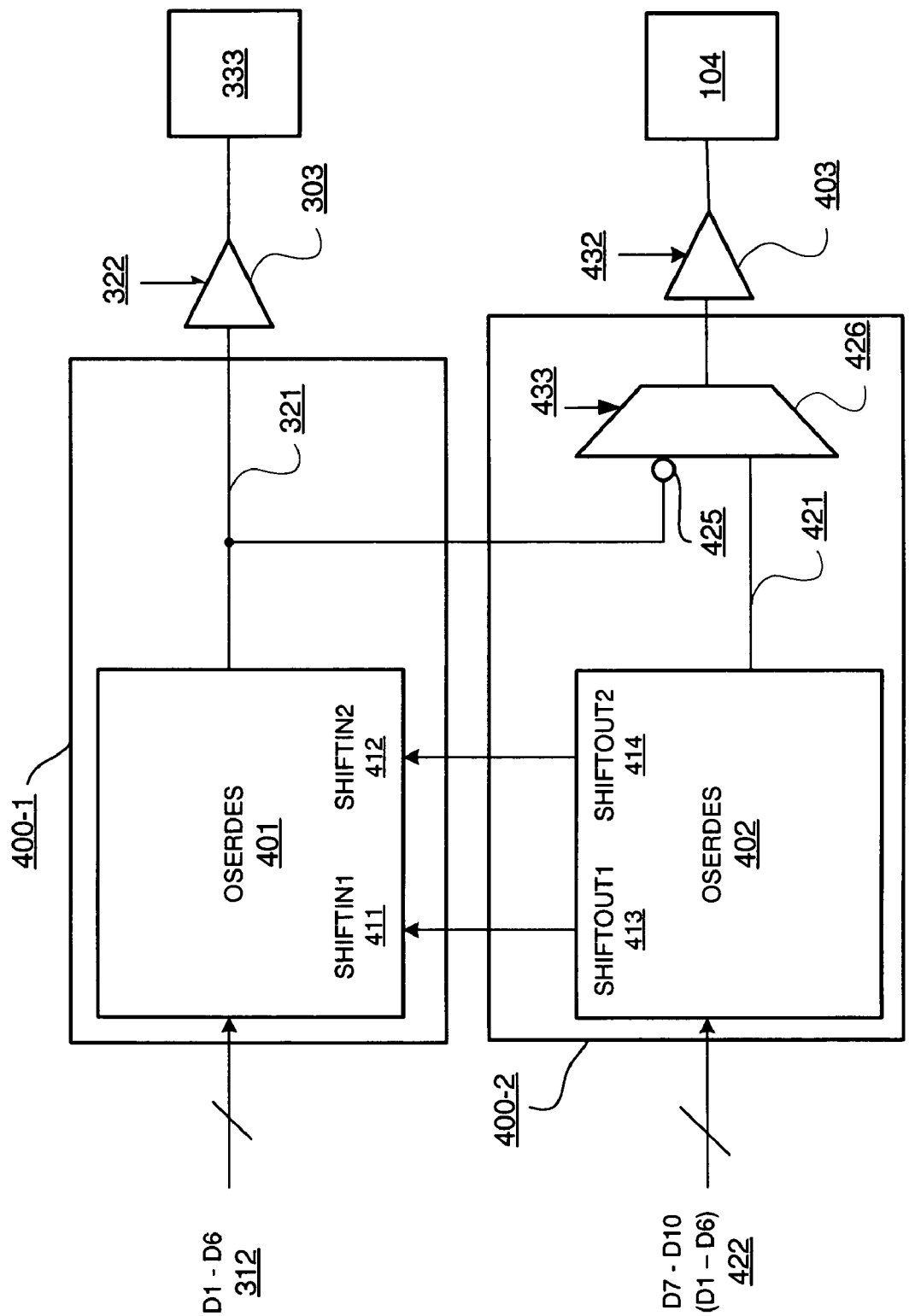
FIG. 4 is a block/schematic diagram depicting an exemplary embodiment of a primary-secondary OSERDES configuration of programmable IO cells.

FIG. 4 is a block/schematic diagram depicting an exemplary embodiment of a primary-secondary OSERDES configuration of programmable IO cells 400-1 and 400-2. OSERDES 401 is the primary OSERDES, and OSERDES 402 is the secondary OSERDES. OSERDES 401 and 402 are similar to OSERDES 101 of FIG. 3, and thus the description of same or similar elements is not repeated. Though only two OSERDES are described as being stacked, it should be understood that more than two OSERDES may be stacked.

OSERDES 401 receives parallel data input 312, and OSERDES 402 receives parallel data input 422. Again, by way of example and not limitation, parallel data input may be up to four bits wide, namely, D7 through D10 or D3 through D6, depending on configuration. Notably, for this exemplary embodiment, OSERDES, and ISERDES described below, have data paths corresponding in part to known IO circuitry of earlier FPGAS. Thus, conventional circuitry for IO is used as part of OSERDES and ISERDES described herein. Thus, OSERDES and ISERDES do not have to be an option where known IO circuitry is bypassed. Accordingly, through additional reprogrammable circuitry (not shown), a user may revert back to known IO circuitry of which D1 and D2 are inputs. However, by not adding such additional circuitry, D1 and D2, which drive circuits of a subsequent stage, have less load to drive and thus are less hampered with respect to a top frequency of operation. By using only D3 through D6, additional circuitry may be added with little to no impairment of the top frequency of operation. Shift out ports 413 and 414 of OSERDES 402 are respectively coupled to shift in ports 411 and 412 of OSERDES 401. In this configuration, carry bits output from OSERDES 402 are input to OSERDES 401.

For differential signaling, pad 333 is for example a positive side and pad 104 is a negative side of a differential pair. For differential signaling, OSERDES 402 serial data output is shifted out from output port 413 of OSERDES 402 to shift input port 411 of OSERDES 401 for SDR. For DDR, OSERDES 402 serial data output is shifted out from output ports 413 and 414 of OSERDES 402 to shift input ports 411 and 412, respectively, of OSERDES 401.

Thus, for differential signaling, serial data output 321 is input from OSERDES 401 to buffer 303 and to inverter 425. Output of inverter 425 is provided as input to multiplexer ("MUX") 426. Another input to MUX 426 is serial data output 421 from OSERDES 402. However, for a differential signaling mode, output of inverter 425 is selected for the output of MUX 426 responsive to select control signal 433 provided to MUX 426. Output of MUX 426 is input to buffer 403, which is subject to tri-state control by tri-state control signal 432. In this embodiment, all differential voltage processing is done in output buffers, such as output buffers 303 and 403. Notably, in this embodiment, no additional circuitry was used to expand tri-state control data inputs 306 of FIG. 3, and thus tri-state serial control data signals 322 and 432 are generated from the same tri-state control data input 306 for tri-state control of buffers 303 and 403, respectively. However, additional circuitry, such as additional flip-flops, may be used to expand data width of an OSERDES. Tri-state control input data width may be expanded, as was done for expanding input data width, at least in part by using shift in and shift out ports.

Output from buffer 303 is provided to IO pad 333 and output from buffer 403 is provided to IO pad 104, subject to control of tri-state control signals 322 and 432, to provide a differential output interface. It should be understood that LVDS, and other signaling schemes, operates at high frequencies, and thus increasing parallel input data width facilitates meeting such frequencies with lower clock frequencies.

It should be appreciated that an FPGA has multiple programmable IO cells, which may be configured like IO cells 400-1 and 400-2. Such programmable IO cells may include flip-flops, inverters, buffers, and multiplexers that may be interconnected through programming. Thus, data width may be expanded, such as for differential signaling, without adding additional circuitry to the FPGA. In other words, a larger parallel to serial converter is provided by using resources in FPGA IOBs. Notably, some programmable circuitry, such as flip-flops and multiplexers, has been added to a conventional IOB, and may be used in other types of integrated circuits.

For a single-ended output, MUX 426 selects serial data output 421 for output of MUX 426 responsive select control signal 433. Serial data output 421 is converted from parallel data input 422, which may be thought of as data bits D1 through D6 in single-ended mode in contrast to data bits D7 through D10 for differential mode. In single-ended mode, OSERDES 402 has all its input data width available. In single-ended mode, serial data output 321 is output via IO pad 333 and serial data output 421 is output via IO pad 104.

Figure 4A:
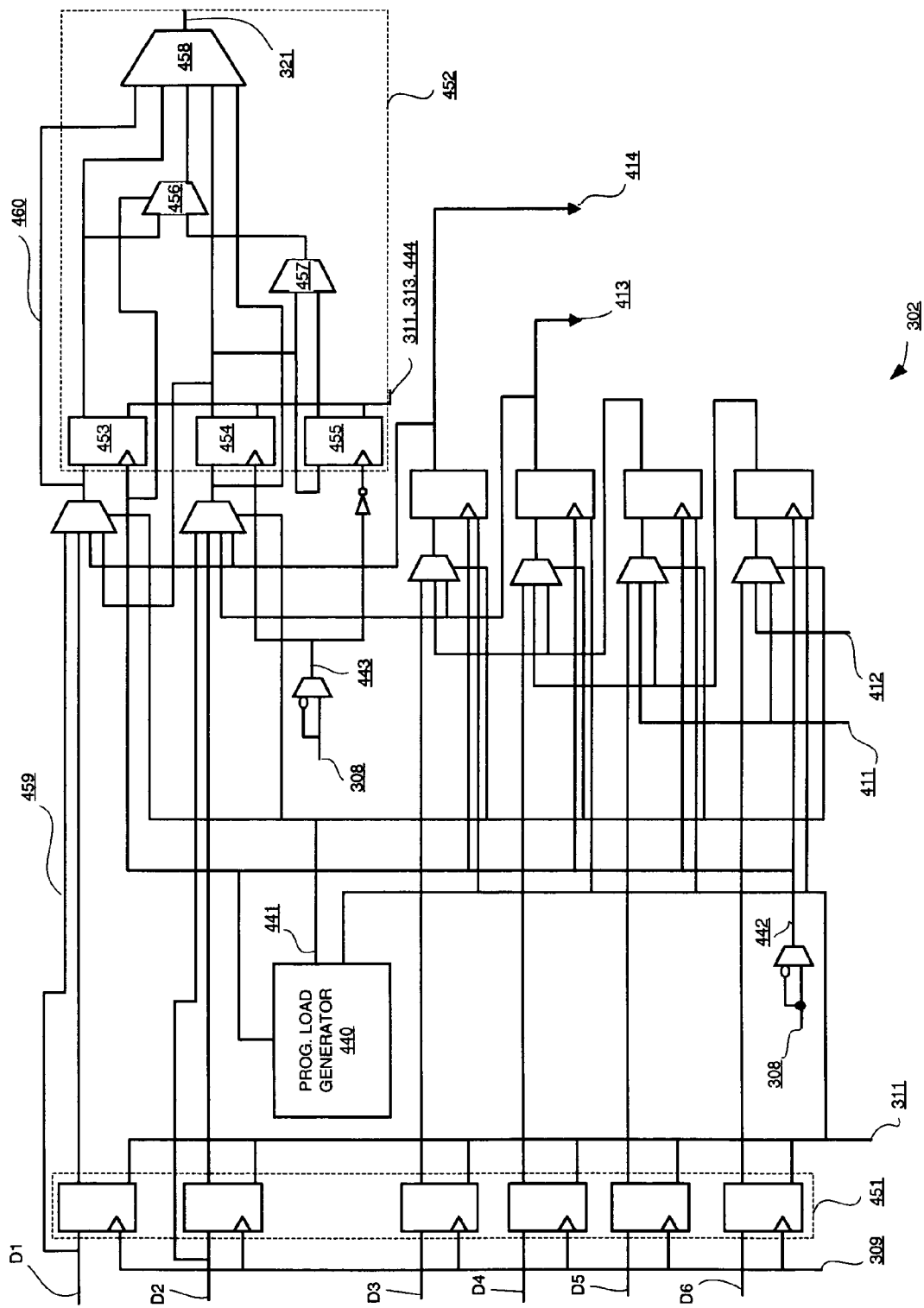
FIG. 4A is a schematic diagram depicting an exemplary embodiment of an OSERDES.

FIG. 4A is a schematic diagram depicting an exemplary embodiment of parallel to serial converter 302. Inputs D1 through D6 are respectively provided to registers 451 which are clocked responsive to a divided clock signal 309 and reset via reset signal 311. Output clock signal 308 is described in additional detail in a co-pending U.S. patent application entitled "Bimodal Source Synchronous Interface" by Sasaki et al., filed on the date hereof, which is incorporated herein in its entirety.

Input shift in ports 411 and 412 are used when OSERDES 101 is a primary OSERDES, and output shift out ports 413 and 414 are used when OSERDES 101 is a secondary OSERDES. More particularly, when in an SDR mode, a single shift-register chain is used, and thus only one shift in port 411 and one shift out port 413 is used. However, when in a DDR mode, two shift register chains are used, and thus both shift in ports 411 and 412, as well as both shift out ports 413 and 414, are used.

Registers 453, 454, 455 and multiplexers 456, 457, 458 form a portion of an output path 452. Registers 453 and 454, as well as multiplexer 456, are from known output circuitry. Registers 453, 454 and 455 may be reset responsive to one or more of reset signal 311, OCE signal 313, and a set vector ("REV") signal 444. Notably, if reset signal 311 is a set signal, then REV signal 444 is the inverse, namely, a reset signal.

Registered outputs may be used for SDR or DDR types of data. Additionally, bypass lines 459 and 460, for example, may be used for combinatorial output.

OSERDES 101 includes a programmable load generator 440. FIG. 4B is a schematic diagram depicting an exemplary embodiment of a programmable load generator 440. Registers 461 through 464 form a counter, which in this example is a 4-bit counter. Registers 461 through 464 are clocked responsive to clock signal 442. Input register 466 is clocked responsive to output divided clock signal 309, and output from register 466 is provided as data input to register 465, the latter of which is clocked responsive to clock signal 442. Data output from register 465 is provided as a reset signal to registers 461 through 464. Registers 465 and 466 are reset via reset signal 311. Outputs from each register 461 through 464 are respectively provided to AND gates 471 through 474. Output from register 461 is provided to each of AND gates 472 through 474. The outputs from AND gates 471 through 474 are provided as data inputs to a multiplexer 475, the output of which is load signal 441. AND gates 471 through 474 and multiplexer 475 form a decoder.

Generally, when load signal 441 is a logic level zero, data transfer from one register to a next register in a chain is allowed. This chain of registers is clocked responsive to output divided clock signal 309. Within a time window, load signal 441 goes to a logic level one, which transfers data from registers clocked responsive to output divide clock signal 309 to registers clocked responsive to clock signal 308. The window of time or appropriate time is determined by the divide ratio between output clock signal 308 and output divided clock signal 309.

Figure 4C:
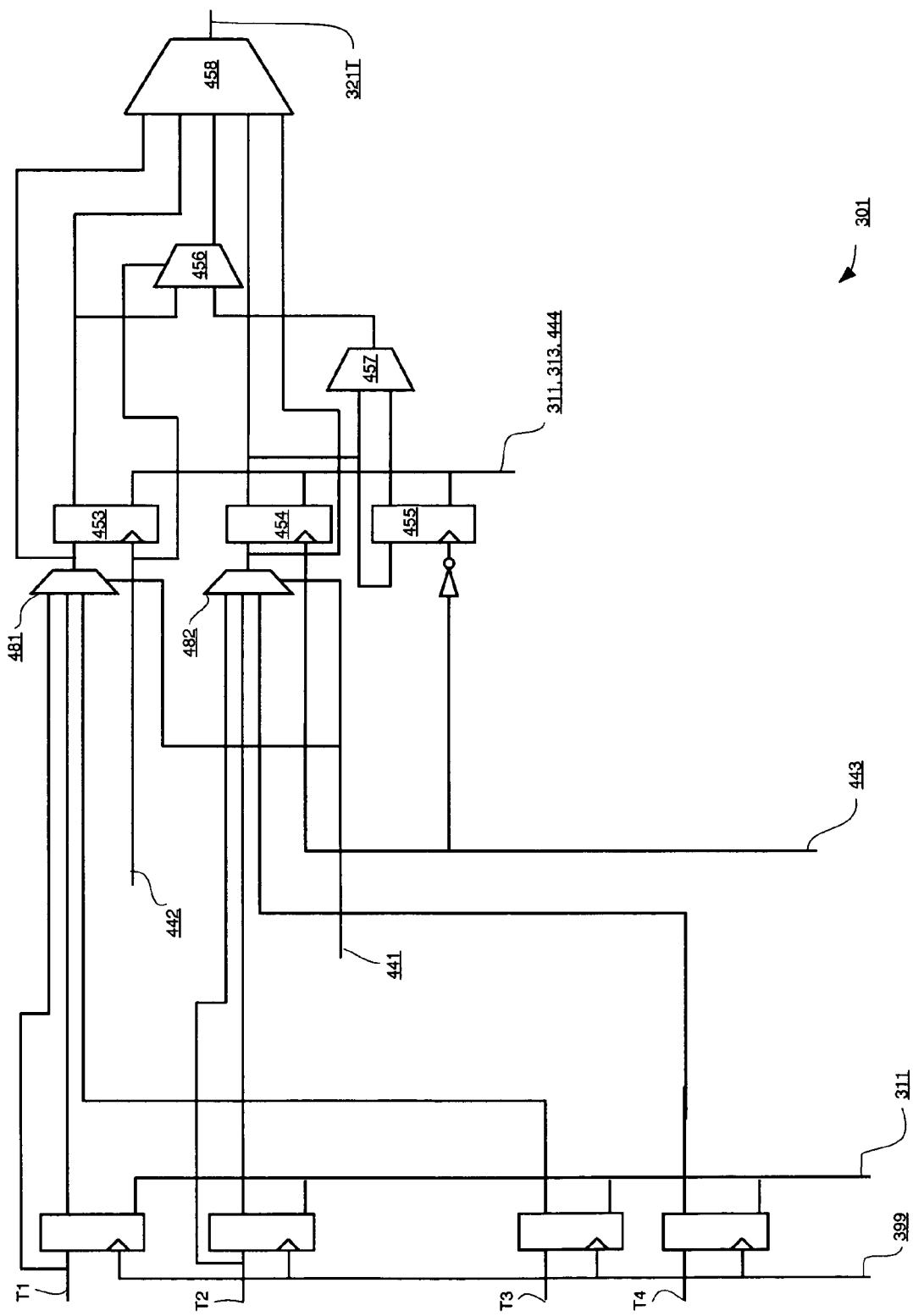
FIG. 4C is a schematic diagram depicting an exemplary embodiment of an OSERDES for providing tri-state control.

FIG. 4C is a schematic diagram depicting an exemplary embodiment of parallel to serial converter 301. For OSERDES 101 for tri-state control, circuitry for shift in and shift out ports is not used in OSERDES 101 though it may be present. Tri-state control inputs T1 through T4 are respectively provided to registers clocked responsive to output divided clock signal 309. Register 453 is clocked responsive to clock signal 442, and registers 454 and 455 are clocked responsive to clock signal 443. Output from multiplexers 481 and 482 is provided as combinatorial output to multiplexer 458 and is provided for registered data input to registers 453 and 454, respectively. Load signal 441 is provided as a select control signal to multiplexers 481 and 482.

Multiplexer 457 and register 455 have been added to known output circuitry to output DDR data. An inverted version of clock signal 443 is used to clock register 455. Output from register 454 is provided as data input to register 455 and to multiplexer 457. Output from register 455 is provided as another data input to multiplexer 457, and the output from multiplexer 457 is provided as input to multiplexer 456.

The load signal is used to control parallel to serial conversion. Thus, it should be understood that tri-state control circuitry and data path circuitry employ the same circuits, except when shift in or shift out ports are used.

At this point, it should be appreciated an OSERDES as described herein may be a superset of a known basic output for FPGAs. An OSERDES need not have a separate block that bypasses known basic output circuitry, but actually incorporates such known basic circuitry while providing means for a source synchronous interface. This is important for providing FPGAs with backward compatible designs, and may also result in area and cost savings.

Figure 5:
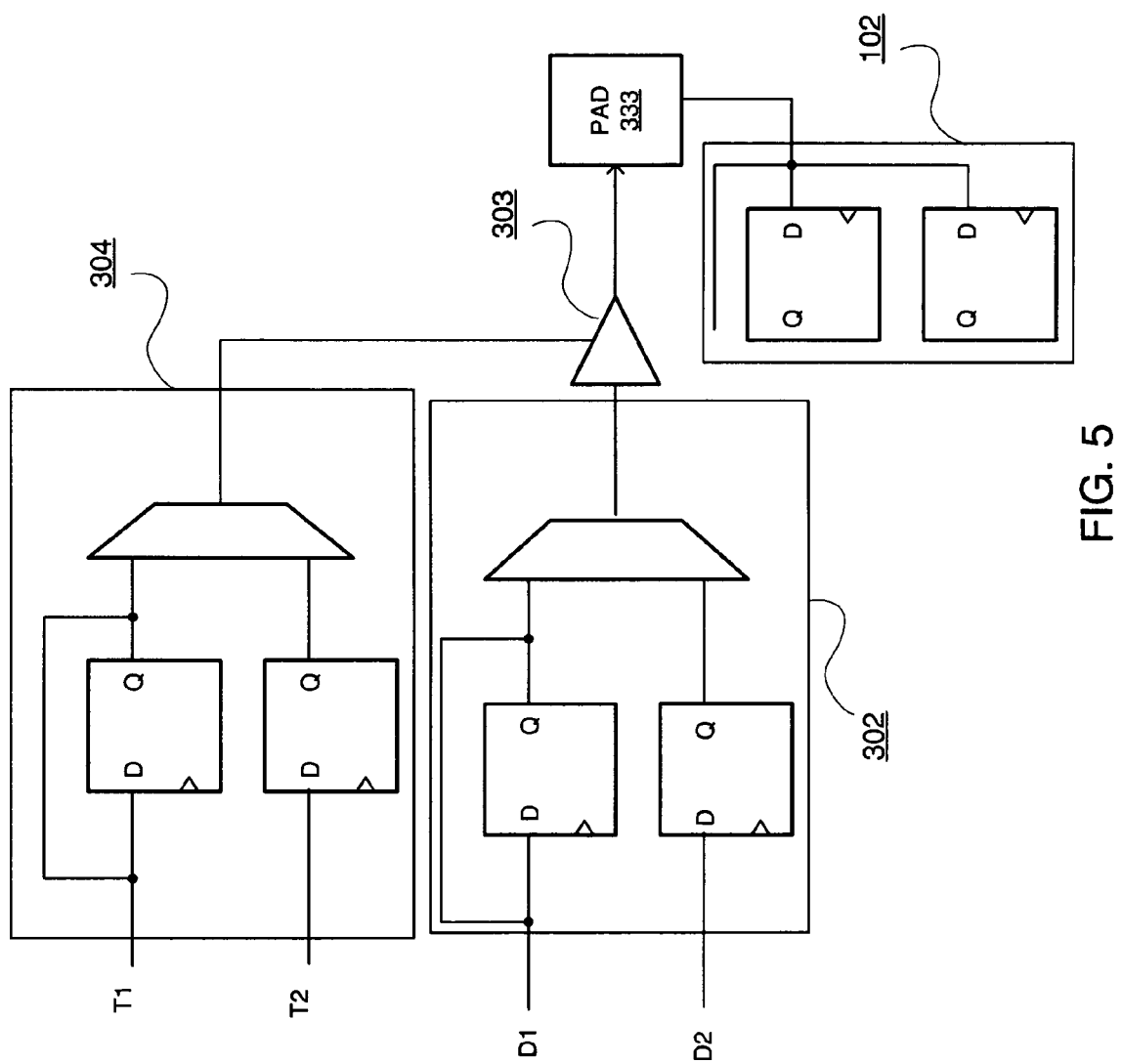
FIG. 5 is a schematic diagram depicting an exemplary embodiment of a portion of an OSERDES instantiated in a programmable 10B of an FPGA.

FIG. 5 is a schematic diagram depicting an exemplary embodiment of a portion of an OSERDES 101 instantiated in a programmable 10B of an FPGA. For purposes of clarity only two tri-state data inputs T1 and T2 and two data inputs D1 and D2 are shown, as it will be apparent that more than two tri-state and data inputs may be used. Notably, pad 333 may be used for input and output. For input to pad 333, buffer 303 is tri-stated. Accordingly, input to pad 333 is provided to ISERDES 102, a portion of which is illustratively shown. Accordingly, it should again be understood that tri-state control and data path circuits are separate and independent.

Figure 6B:
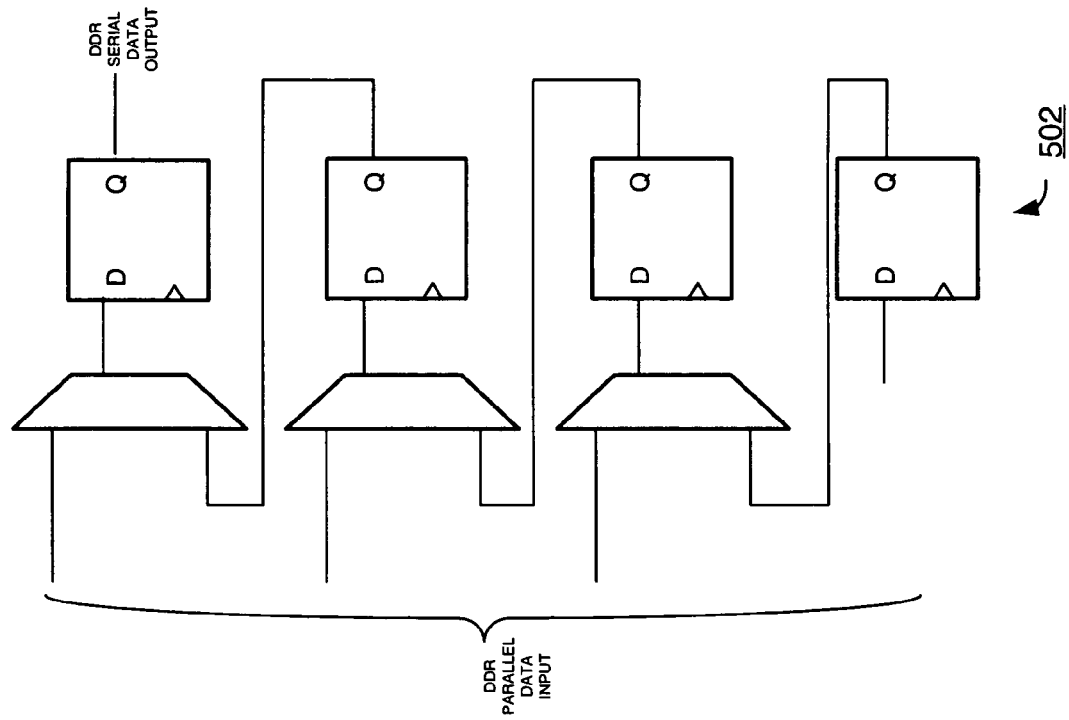
FIGS. 6A and 6B are schematic diagrams depicting exemplary embodiments of OSERDES output chains for DDR.
Figure 6A:
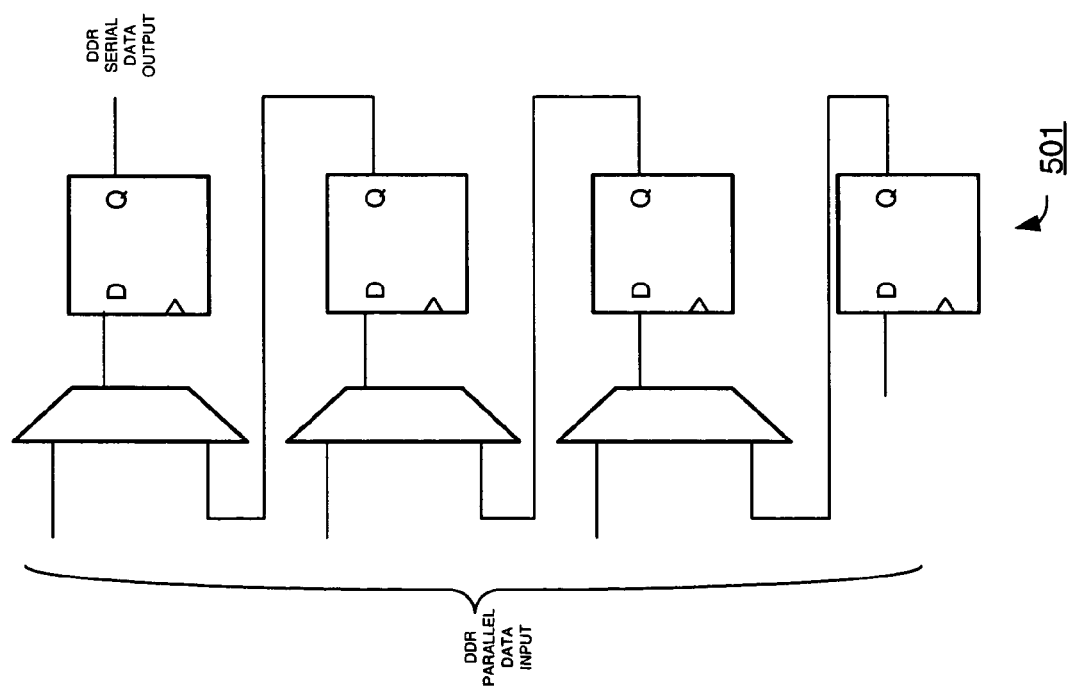

FIGS. 6A and 6B are schematic diagrams depicting exemplary embodiments of OSERDES output chains 501 and 502 for DDR. For DDR, two output chains, such as chains 501 and 502, are used to provide parallel to serial conversion. One programmable 10B may be configured to provide one of chains 501 and 502, and another programmable 10B may be configured to provide another one of chains 501 and 502. Though two 4-to-1 chains are illustratively shown, other parallel to serial conversion lengths may be used. A load signal from a programmable load generator as previously described provides a select signal to MUXs of chains 501 and 502, and clock signals to flip-flops of chains 501 and 502 may be clock signal 308.

Figure 6C:
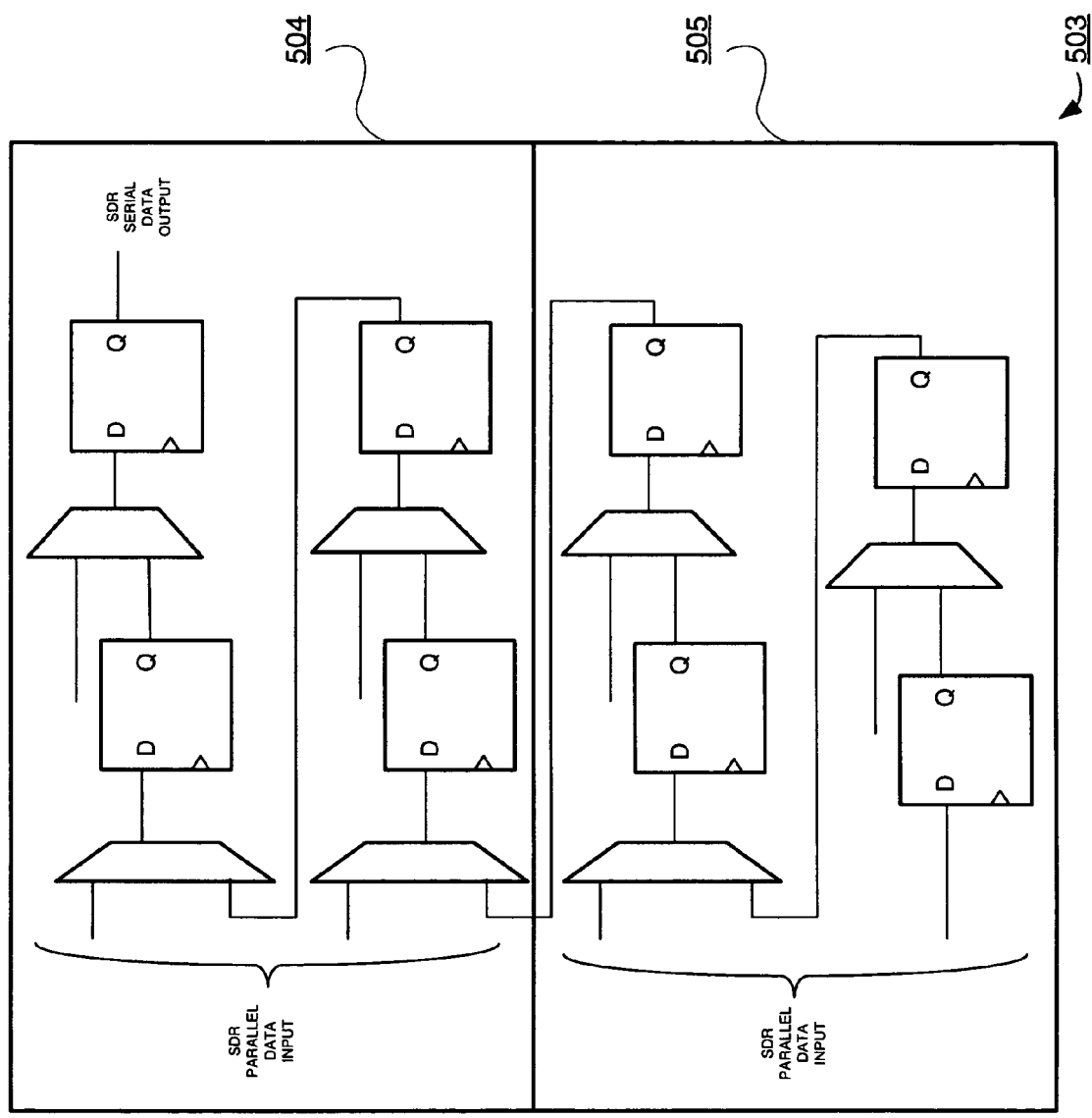
FIG. 6C is a schematic diagram depicting an exemplary embodiment of an OSERDES output chain for SDR.

FIG. 6C is a schematic diagram depicting an exemplary embodiment of an OSERDES output chain 503 for SDR. For SDR, one chain, such as chain 503, is used to provide parallel to serial conversion. Two programmable IOBs, such as IOBs 504 and 505, may be coupled in series to increase chain length. Though an 8-to-1 chain is illustratively shown, other parallel to serial conversion lengths may be used. A load signal from a programmable load generator as previously described provides a select signal to MUXs of chain 503, and clock signals to flip-flops of chain 503 may be clock signal 308.

It should be appreciated that by having two chains for DDR, clock rate to input data is reduced. In other words, by having two chains for DDR, the highest clock rate for SDR and DDR may be the same. If only one chain were used for DDR, then it would have to be clocked at twice the frequency of that of the two chains used herein. Furthermore, it should be appreciated that DDR chains and the SDR chain of an OSERDES use and share some of the same circuit elements.

Figure 7:
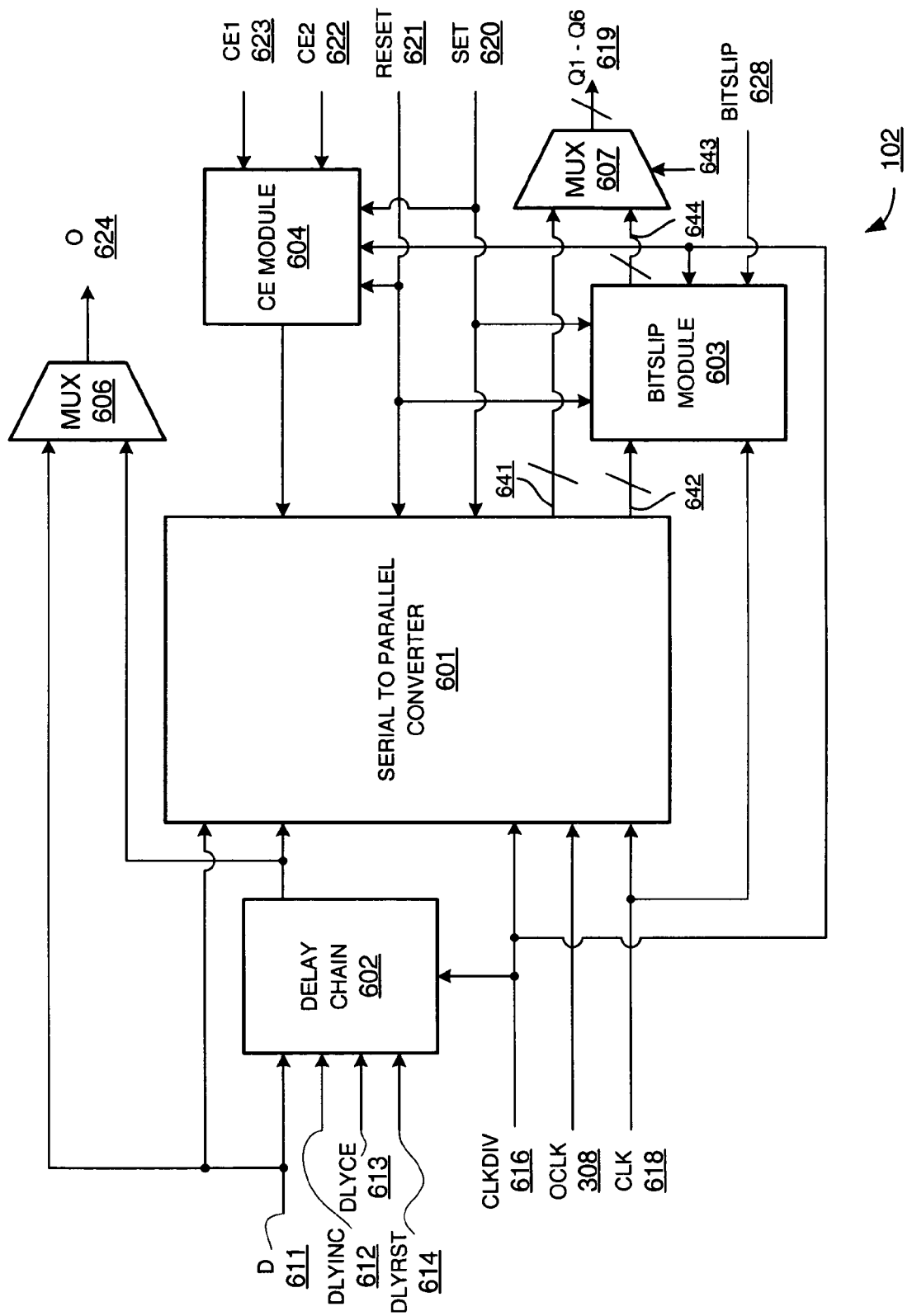
FIG. 7 is a block/schematic diagram depicting an exemplary embodiment of an ISERDES.

FIG. 7 is a block/schematic diagram depicting an exemplary embodiment of an ISERDES 102. Data is received to pad 103 of FIG. 2 for ISERDES 102. This serial data signal, namely, input serial data signal 611, is provided to delay chain 602, to serial to parallel converter 601 and to MUX 606.

Delay chain 602 receives delay increment signal 612, delay clock enable signal 613 and delay reset signal 614. Delay reset signal 614 resets delay chain 602 to a starting delay. Delay increment signal 612 allows the delay imposed by delay chain 602 to be incremented or decremented. The delay may be incremented or decremented by enabling clocking via delay clock enable signal 613. An example of a voltage controlled delay line that may be used for delay chain 602 is found in a co-pending U.S. patent application entitled "Voltage-Controlled Delay Element" by Zhang et al., filed Jul. 12, 2004, which is incorporated herein in its entirety.

Output of delay chain 602 is serial data signal 611 delayed by any delay imposed by delay chain 602. Output of delay chain 602 is provided as input to MUX 606 and input to serial to parallel converter 601. Output of MUX 606 is a combinatorial data output 624.

It should be understood that networking or telecommunication transmissions tend to be over longer distances than for example communication between a memory integrated circuit and an FPGA integrated circuit. Thus, in networking and telecommunication transmissions data are more likely to become askew or "separated" from the clock signal sent with the data. Thus, the data is moved for alignment with the clock in networking or telecommunication transmissions. For networking or telecommunications applications, a delay chain is used to align data to a clock signal. However, for communication with a memory integrated circuit, the clock may become out-of-phase with the data, and thus the clock is phase shifted to align with the data. For memory applications, the clock signal is sent out phase aligned to the data, and thus the receiving device phase shifts the clock signal as appropriate to align it with the data.

Clock signal 618 is from the forwarded clock signal provided with transmitted data whether from a memory interface or a networking/telecommunications interface. Notably, the forwarded clock signal may, though need not be, a free running clock signal. For example in some memory applications, a clock signal may only be forwarded when sending data. If a forwarded clock signal is not a free running clock signal, clock signal 618 is not divided down. If clock signal 618 is not divided down, then an output clock signal as described in a co-pending U.S. patent application entitled "Bimodal Source Synchronous Interface" by Sasaki et al., filed on the date hereof, previously is incorporated herein in its entirety, may be used. However, for purposes of clarity, it will be assumed that clock signal 618 is a free running clock signal. Clock signal 618 may be divided down in frequency to provide clock divided signal 616. Clock signal 618 is provided to serial to parallel converter 601 and to bitslip module 603. Clock divided signal 616 is provided to clock delay chain 602, to clock enable module 604, to bitslip module 603, and to serial to parallel converter 601. Clock signal 618 is in part for clocking in serial data 611 to serial to parallel converter 601. Clock divided signal 616 is in part for clocking out parallel data from serial to parallel converter 601. Clock divided signal 616 and clock signal 618 are for memory and networking/telecommunication interfacing. Another clock signal, namely, output clock signal 308, is provided to serial to parallel converter 601. Generation of oscillator clock signal is for memory interfacing, and is described in additional detail in a co-pending U.S. patent application entitled "Bimodal Source Synchronous Interface" by Sasaki et al., filed on the date hereof, previously incorporated herein in its entirety. Bitslip module 603 is described in additional detail in a co-pending U.S. patent application entitled "Bimodal Serial to Parallel Converter with Bitslip Controller" by Sasaki et al., filed on the date hereof, which is incorporated herein in its entirety.

Reset signal 621 and set signal 620 are each provided to clock enable module 604, serial to parallel converter 601, and bitslip module 603. Bitslip enable signal 628 is provided to bitslip module 603 to active or deactivate bitslip adjustment. Respective clock enable signals 622 and 623 are provided to clock enable module 604. Output of clock enable module 604 is a clock enable signal which is provided to serial to parallel converter 601. Clock enable module 604 is a parallel to serial converter. Clock enable module 604 facilitates a slower clock signal to be used in programmable fabric of an FPGA previously used to clock out serial data from the FPGA. Output of clock enable module 604 is a clock enable signal for input registers of serial to parallel converter 601. If the output of clock enable module 604 is a logic level one, data enters serial to parallel converter 601 and will appear at output 641 and 642 thereof. If the output of clock enable module 604 is a logic level zero, input registers of serial to parallel converter 601 are disabled, thereby preventing data from entering serial to parallel converter 601.

For data from a memory transmission, such data is converted from serial to parallel data, which parallel data is output from serial to parallel converter 601 via data path 641 to MUX 607. Control signaling 643 may be provided to MUX 607 to select data from data path 641 for output data 619.

For data from a networking/telecommunications transmission, such data is converted from serial to parallel data, which parallel data is output from serial to parallel converter 601 via data path 642 to bitslip module 603. This data, after any bitslip adjustment by bitslip module 603, is output from bitslip module 603 to MUX 607 via data path 644. Control signaling 643 may be provided to MUX 607 to select data from data path 644 for output data 619.

For example, serial to parallel converter 601 may be configured to provide a parallel output ranging from 2 to 6 bits wide. Correspondingly, output data 619 will be from 2 to 6 bits wide, namely, Q1–Q6.

Figure 8:
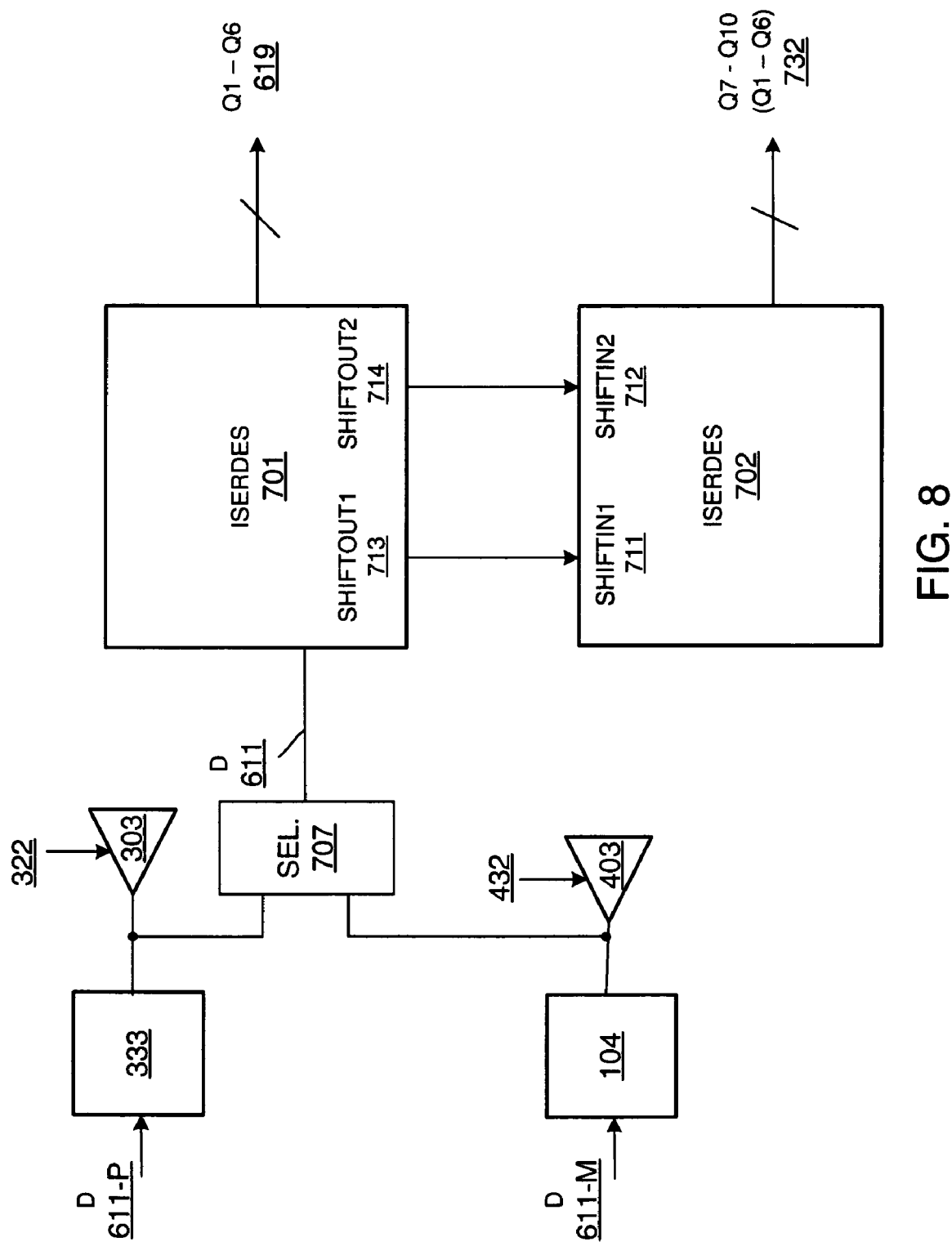
FIG. 8 is a block diagram/schematic diagram depicting an exemplary embodiment of a primary-secondary ISERDES configuration of programmable IO cells.

FIG. 8 is a block diagram/schematic diagram depicting an exemplary embodiment of a primary-secondary ISERDES configuration of programmable IO cells 400-1 and 400-2. It should be understood that both an ISERDES and an OSERDES may be instantiated in a signal programmable 10B. ISERDES 701 is the primary ISERDES, and ISERDES 702 is the secondary ISERDES. ISERDES 701 and 702 are similar to ISERDES 102 of FIG. 7, and thus the description of same or similar elements is not repeated. Additionally, it should be understood that by stacking ISERDES data width may be increased, which may be used to accommodate data input that is single-ended or differential.

Buffers 303 and 403 are tri-stated via tri-state control signals 322 and 432 for receiving positive side and negative side data signals 611-P and 611-M. Data signals 611-P and 611-M are input to select circuit 707 via pads 333 and 104, respectively. Output of select circuit 707 is data signal 611. Select circuit 707 is used to either a select single-ended data mode or a differential data mode. Notably, though two pads are provided for differential input, only one data path is used.

Data from data signal 611 is input to ISERDES 701. For ISERDES 701 providing a 2 to 6 bit output, bits locations in excess of the sixth bit are shifted out via one or more shift output ports. For SDR, bits above the sixth bit are shifted out of ISERDES 701 via shift output port 713 to shift input port 711 of ISERDES 702. For DDR, bits above the sixth bit are shifted out of ISERDES 701 via shift output ports 713 and 714 to shift input ports 711 and 712, respectively, of ISERDES 702. This may be done in an alternating manner. Output of ISERDES 701 is output data bits 619 from Q1 to Q6, and output of ISERDES 702 is output data bits 732 from Q7 to Q10. Again, notably bit widths may vary depending on implementation, and thus these are merely examples of bit widths as other bit widths may be used.

Additionally, it should be appreciated that ISERDES 702 may be used independently from ISERDES 701, such as when both are used for receiving single-ended signaling. If used for single-end signaling, output of ISERDES 702 is Q1 through Q6, as all data output resources are available.

Notably, data signal 611 may be a DDR or SDR data signal. Again, like an OSERDES, an ISERDES uses the same or similar resources for DDR and SDR but with different connections. By using programmable elements, such elements may be programmed to change interconnects between circuit elements.

Figure 9B:
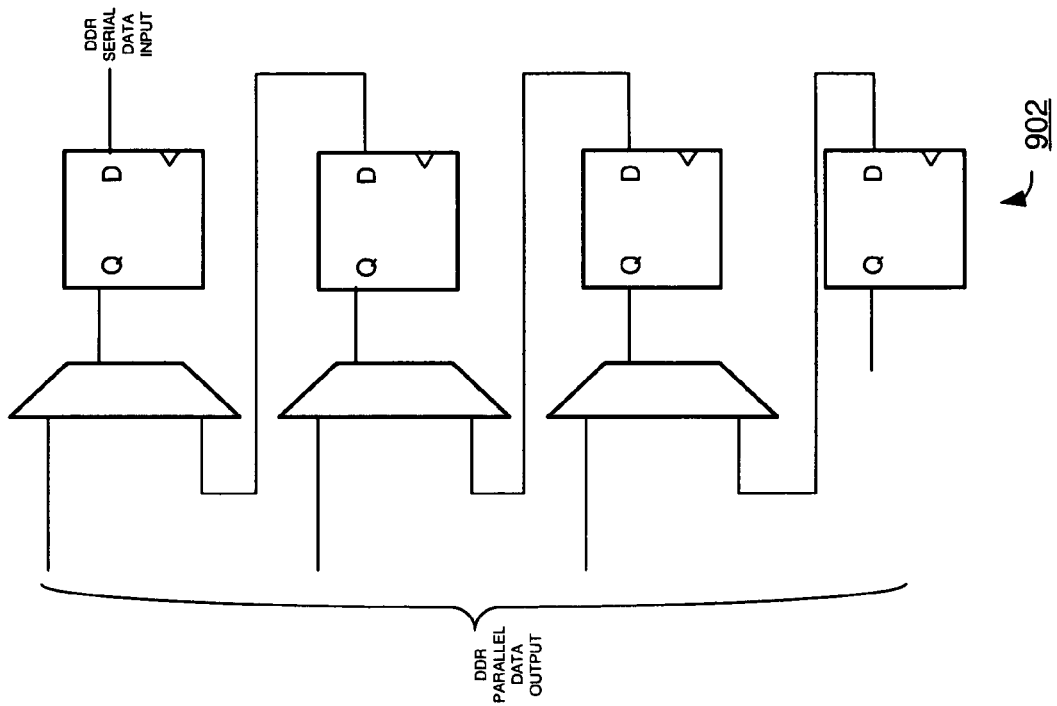
FIGS. 9A, 9B and 9C, show respective exemplary embodiments of serial to parallel conversion chains 901, 902 and 903, respectively.
Figure 9A:
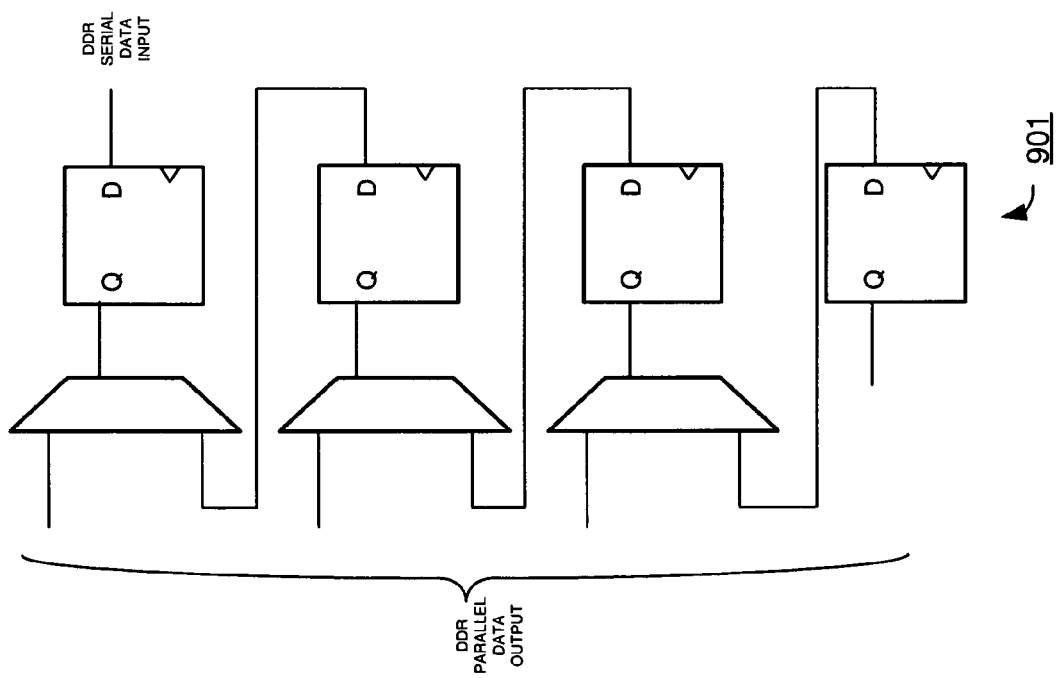
Figure 9C:
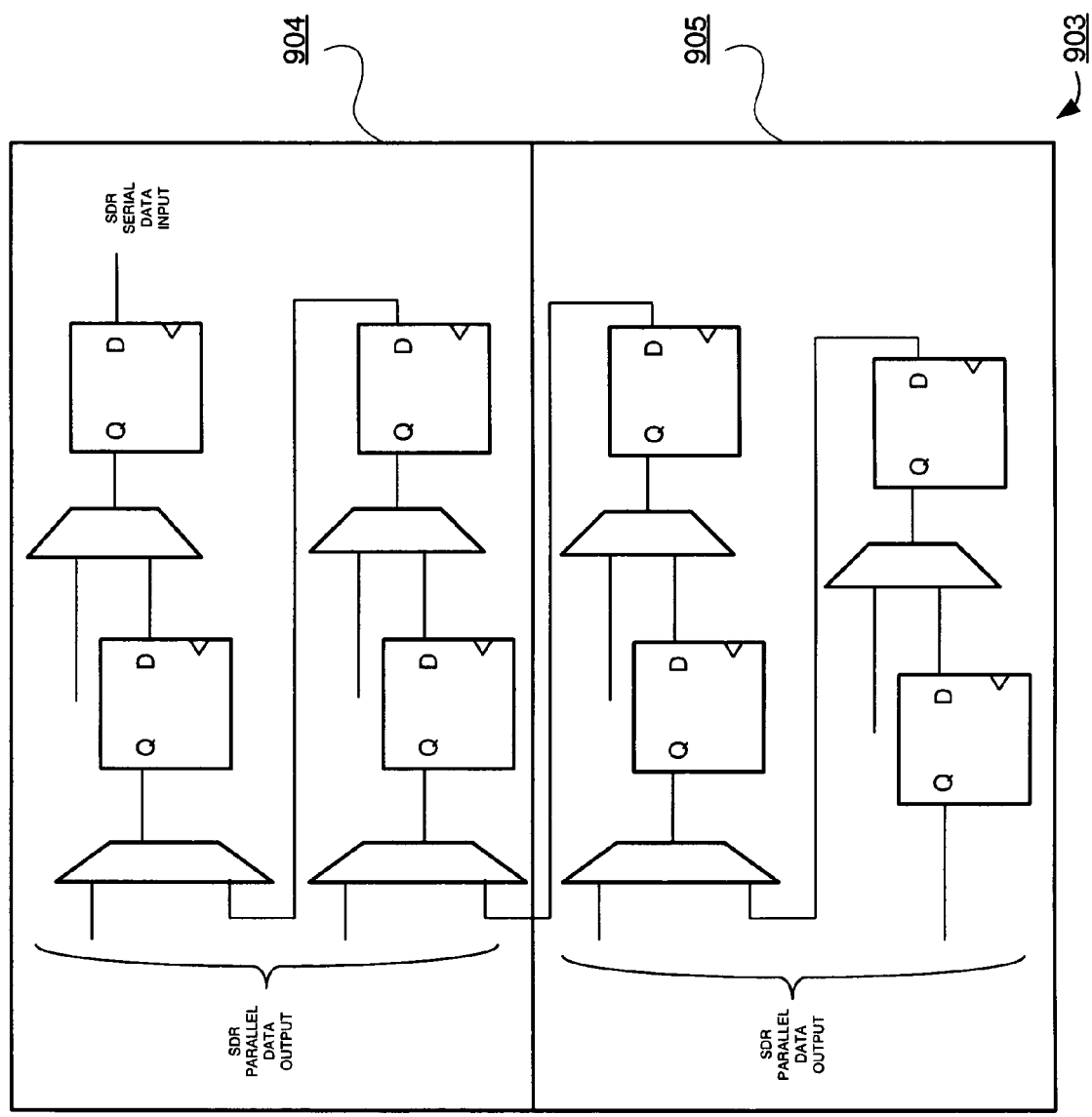

Referring to FIGS. 9A, 9B and 9C, there are shown respective exemplary embodiments of serial to parallel conversion chains 901, 902 and 903, respectively. For a DDR signal, data 611 is divided out according to rising or falling edges of a clock signal onto one of two chains, such as chains 901 and 902. For an SDR signal, data 611 is provided to one chain, such as chain 903.

Figure 10:
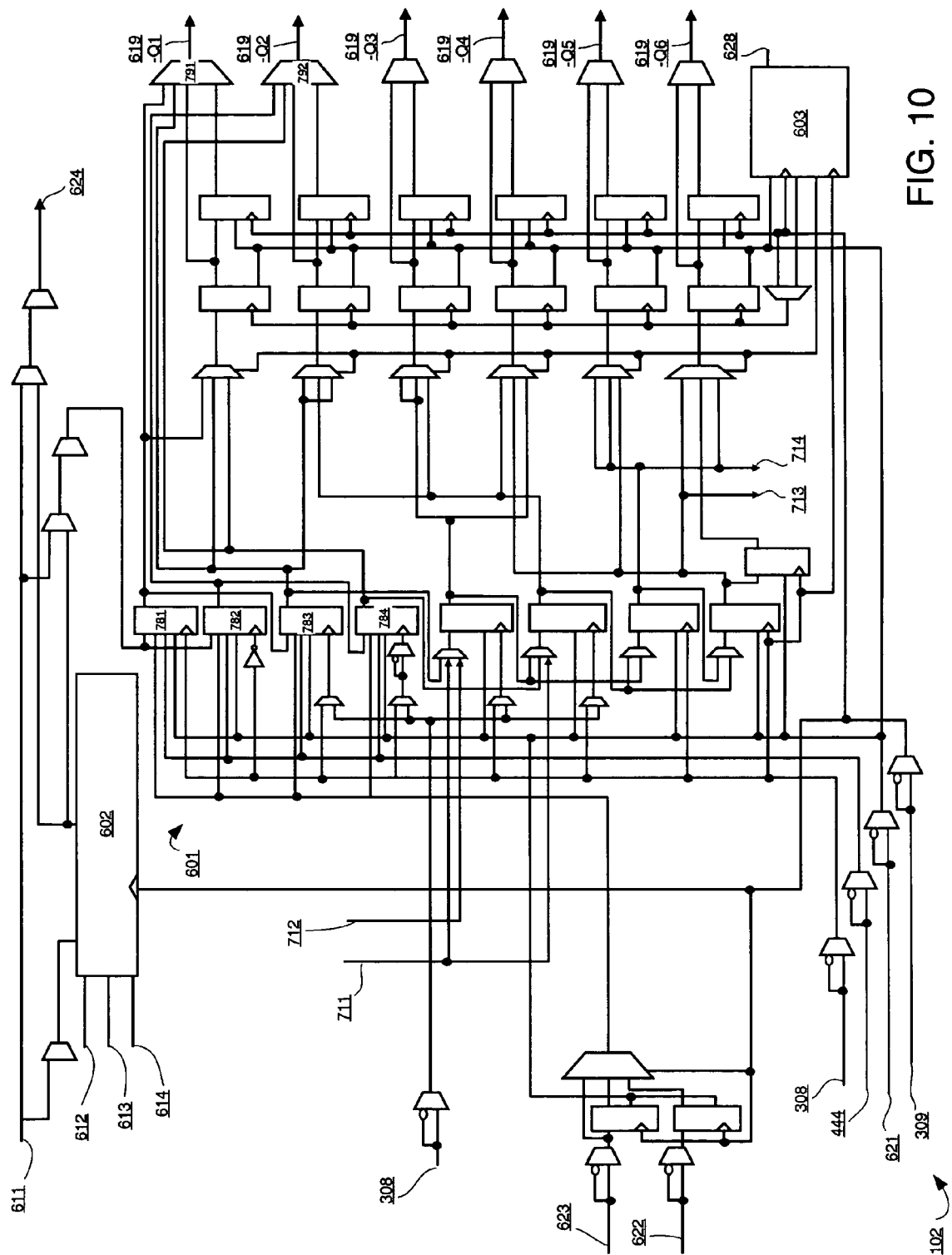
FIG. 10 is a schematic diagram depicting an exemplary embodiment of a serial to parallel converter that may be implemented in ISERDES.

FIG. 10 is a schematic diagram depicting an exemplary embodiment of ISERDES 102. Input port 711 is used when ISERDES 102 is a secondary SERDES in a stack and SDR is used. Input ports 711 and 712 are used when ISERDES 102 is a secondary SERDES in a stack and DDR is used. Output port 713 is used when ISERDES 102 is a primary SERDES in a stack and SDR is used. Output ports 713 and 714 are used when ISERDES 102 is a primary SERDES in a stack and DDR is used. A serial to parallel converter that may be used for ISERDES 102 is described in additional detail in a co-pending U.S. patent application entitled "Bimodal Serial to Parallel Converter with Bitslip Controller" by Sasaki et al., filed on the date hereof, previously is incorporated herein in its entirety.

Registers 781 and 782, as well as multiplexer 791, are part of known input circuitry. Registers 783 and 784, as well as multiplexer 792, have been added to the input data path for outputting DDR data. Notably, for this exemplary embodiment, ISERDES, and OSERDES described above, have data paths corresponding in part to known IO circuitry of earlier FPGAs. Thus, conventional circuitry for IO is used as part of OSERDES and ISERDES described herein. Thus, OSERDES and ISERDES do not have to have an option where known IO circuitry is bypassed. This facilitates backward compatibility. Furthermore, integration of an ISERDES and an OSERDES into circuitry of an IO cell negates having to employ duplicate circuitry to support both input and output functions thereof, thereby leading to cost efficiency.

Figure 11:
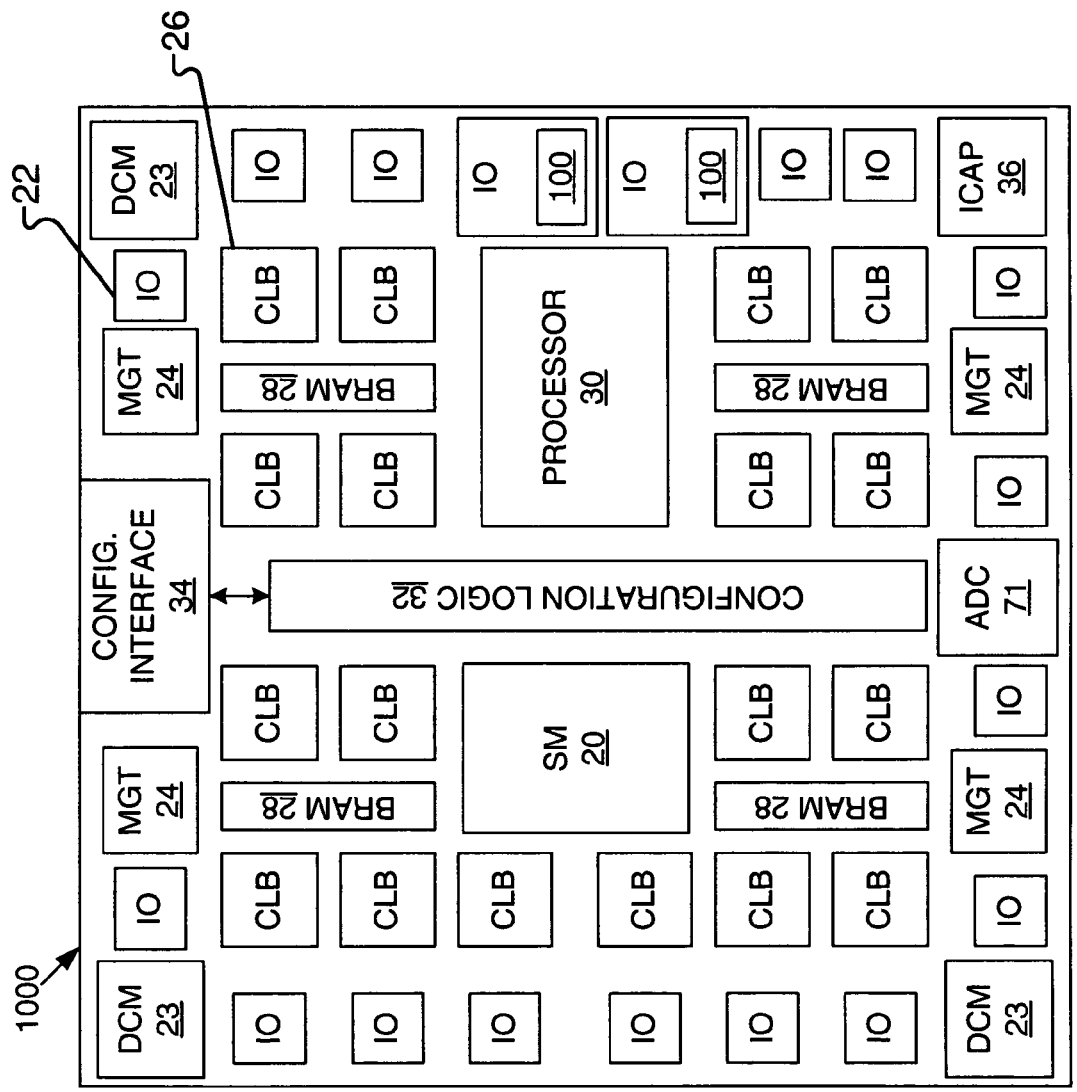
FIG. 11 is a high-level block diagram depicting an exemplary embodiment of a Field Programmable Gate Array ("FPGA").

FIG. 11 is a high-level block diagram depicting an exemplary embodiment of a Field Programmable Gate Array ("FPGA") 1000. FPGA 1000 is an example of a software configurable integrated circuit. However, other programmable devices such as programmable logic devices ("PLDs") other than FPGAs, including complex PLDs ("CPLDs"), and other integrated circuits with configurable logic, may be used.

FPGA 1000 may include various resources such as configurable logic blocks ("CLBs") 26, programmable input/output blocks ("IOBs") 22, memory, such as block random access memory 28, delay lock loops (DLLs) and multiply/divide/de-skew clock circuits which collectively provide digital clock managers ("DCMs") 23, and multi-gigabit transceivers ("MGTs") 24. An external memory may be coupled to FPGA 1000 to store and provide a configuration bitstream to configure FPGA 1000, namely, to program one or more configuration memory cells to configure CLBs 26, IOBs 22 and other resources. Notably, IOBs 22, as well as MGTs 24, may be disposed in a ring or ring-like architecture forming a perimeter of I/Os around CLBs 26 of FPGA 1000 in some embodiments, although other configurations are possible. For example, an alternative FPGA arrangement is described in a co-pending U.S. patent application Ser. No. 10/683,944, entitled "Columnar Architecture", by Young, filed Oct. 10, 2003, which is incorporated by reference herein in its entirety.

Additionally, FPGA 1000 may include other resources such as an Internal Configuration Access Port ("ICAP") 36, an embedded processor 30, an embedded system monitor 20 with an Analog-to-Digital Converter ("ADC"), and an embedded second ADC 40. Though FPGA 1000 is illustratively shown with a single embedded processor 30, FPGA 1000 may include more than one processor 30. Additionally, known support circuitry for interfacing with embedded processor 30 may be included in FPGA 1000. Furthermore, rather than an embedded processor 30, processor 30 may be programmed into configurable logic such as a "soft" processor 30.

Although FIG. 11 illustratively shows a relatively small number of IOBs 22, CLBs 26 and BRAMs 28, for purposes of example, it should be understood that an FPGA 1000 conventionally includes many more of these elements. Additionally, FPGA 1000 includes other elements, such as a programmable interconnect structure and a configuration memory array, which are not illustratively shown in FIG. 11.

FPGA 1000 is configured in response to a configuration information (commands and data) bitstream, which is loaded into a configuration memory array of FPGA 1000 from an external memory, e.g., a read-only memory ("ROM"), via configuration interface 34 and configuration logic 32. Configuration interface 34 can be, for example, a select map interface, a Joint Test Action Group ("JTAG") interface, or a master serial interface. Alternatively, with respect to external configuration or reconfiguration, FPGA 1000 may be internally reconfigured through use of ICAP 36 or a dynamic reconfiguration port. A dynamic reconfiguration port is described in additional detail in a co-pending U.S. patent application Ser. No. 10/837,331, entitled "Reconfiguration Port for Dynamic Reconfiguration", by Vadi et al., filed Apr. 30, 2004, which is incorporated by reference herein in its entirety.

With renewed reference to FIG. 11, configuration memory may include columns of memory cells, where each column includes a plurality of bits. Configuration data is conventionally divided out into data frames. Configuration data may be loaded into the configuration memory array one frame at a time via configuration interface 34 or ICAP 36, or in sub-frame increments via a dynamic reconfiguration port. One or more IOBs 22 may include a SERDES 100 as described herein.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A serializer-deserializer instantiated in configurable logic of an integrated circuit, comprising:

an output serializer-deserializer portion instantiated in a portion of the configurable logic, the output serializer-deserializer portion including a first data port;

an input serializer-deserializer portion instantiated in another portion of the configurable logic, the input serializer-deserializer portion including a second data port;

an input/output pad coupled to the output serializer-deserializer portion via an output buffer and coupled to the input serializer-deserializer portion;

the output serializer-deserializer portion configured to receive first parallel data via the first data port, to convert the first parallel data to first serial data and to output via the output buffer and the input/output pad the first serial data; and the input serializer-deserializer portion configured to receive second serial data via the input/output pad, to convert the second serial data to second parallel data and to output via the second data port the second parallel data;

wherein the input serializer-deserializer portion comprises a serial to parallel converter for providing the second parallel data; and wherein the input serializer-deserializer portion comprises a delay chain coupled to receive the second serial data and configured to delay the second serial data provided to the serial to parallel converter.

2. The serializer-deserializer, according to claim 1, wherein the output serializer-deserializer portion is configurable to operate on Single Data Rate data in one mode and Double Data Rate data in another mode.

3. The serializer-deserializer, according to claim 1, wherein the input serializer-deserializer portion is configurable to operate on Single Data Rate data in one mode and Double Data Rate data in another mode.

4. The serializer-deserializer, according to claim 1, wherein the input serializer-deserializer portion and the output serializer-deserializer portion are independent of one another.

5. The serializer-deserializer, according to claim 1, wherein the output serializer-deserializer portion comprises a first parallel to serial converter and a second parallel to serial converter.

6. The serializer-deserializer, according to claim 5, wherein the first parallel to serial converter is configured to provide a tri-state control signal and coupled to the output buffer to tri-state the output buffer responsive to the tri-state control signal, and wherein the second parallel to serial converter is configured to convert the first parallel data to the first serial data.

7. The serializer-deserializer, according to claim 5, wherein the first parallel data is clocked responsive to a first clock signal and the first serial data is clocked responsive to a second clock signal, the first clock signal being a divided down version of the second clock signal.

8. The serializer-deserializer, according to claim 1, wherein the output serializer-deserializer portion comprises at least one of shift in and shift out ports.

9. The serializer-deserializer, according to claim 1, wherein the output serializer-deserializer portion comprises a programmable load generator.

10. The serializer-deserializer, according to claim 9, wherein the programmable load generator comprises a counter and a decoder.

11. The serializer-deserializer, according to claim 1, wherein the output serializer-deserializer portion comprises an output data path, the output data path including both a known data path and additional circuitry to accommodate Double Data Rate data.

12. The serializer-deserializer, according to claim 1, wherein the integrated circuit is a programmable logic device.

13. The serializer-deserializer, according to claim 12, wherein the programmable logic device comprises a field programmable gate array.

14. The serializer-deserializer, according to claim 1, wherein the second parallel data is clocked responsive to a first clock signal and the second serial data is clocked responsive to a second clock signal within the serial to parallel converter, the first clock signal being a divided down version of the second clock signal.

15. The serializer-deserializer, according to claim 1, wherein the input serializer-deserializer portion comprises a bitslip module coupled to the serial to parallel converter to provide a bitslip adjustment.

16. The serializer-deserializer, according to claim 1, wherein the input serializer-deserializer portion comprises at least one of shift in and shift out ports.

17. The serializer-deserializer, according to claim 1, wherein the input serializer-deserializer portion comprises an input data path, the input data path including both a known data path and additional circuitry to accommodate Double Data Rate data.

18. The serializer-deserializer, according to claim 1, wherein the configurable logic is located in a input/output block.

19. A communication system, comprising:

a first communication device configured to provide a data signal and a forwarded clock signal;

a second communication device configured to receive the data signal and the forwarded clock signal;

at lease one of the first communication device and the second communication device having configurable logic, the at least one of the first communication device and the second communication device including:

an output serializer-deserializer portion instantiated in a portion of the configurable logic, the output serializer-deserializer portion including a first data port;

an input serializer-deserializer portion instantiated in another portion of the configurable logic, the input serializer-deserializer portion including a second data port;

an input/output pad coupled to the output serializer-deserializer portion via an output buffer and coupled to the input serializer-deserializer portion;

the output serializer-deserializer portion configured to receive first parallel data via the first data port, to convert the first parallel data to first serial data and to output via the output buffer and the input/output pad the first serial data; and the input serializer-deserializer portion configured to receive second serial data via the input/output pad, to convert the second serial data to second parallel data and to output via the second data port the second parallel data;

wherein the input serializer-deserializer portion comprises:

a serial to parallel converter;

a delay chain coupled to receive the second serial data, delay the second serial data, and provide the delayed second serial data to the serial to parallel converter; and a bitslip module coupled to the serial to parallel converter to provide a bitslip adjustment.

20. The communication system, according to claim 19, wherein the output serializer-deserializer portion is configurable to operate in either a Single Data Rate mode or a Double Data Rate mode.

21. The communication system, according to claim 20, wherein the output serializer-deserializer portion is configured with a single serial chain of registers in an input stage to convert the first parallel data to the first serial data in the Single Data Rate mode and is configured with two serial chains of registers in the input stage to convert the first parallel data to the first serial data in the Double Data Rate mode.

22. The communication system, according to claim 20, wherein the output serializer-deserializer portion comprises a plurality of output serializer-deserializers coupled via shift in and shift out ports.

23. The communication system, according to claim 19, wherein the input serializer-deserializer portion is configurable to operate in either a Single Data Rate mode or a Double Data Rate mode.

24. The communication system, according to claim 23, wherein the input serializer-deserializer portion is configured with a single serial chain of registers in an input stage to convert the second serial data to the second parallel data in the Single Data Rate mode and is configured with two serial chains of registers in the input stage to convert the second serial data to the second parallel data in the Double Data Rate mode.

25. The communication system, according to claim 23, wherein the input serializer-deserializer portion is a plurality of input serializer-deserializers coupled via shift in and shift out ports.

26. A data deserializer instantiated in configurable logic of an integrated circuit, comprising:

an input deserializer instantiated in the configurable logic, the input deserializer including a data interface to programmable circuitry of the integrated circuit;

the input deserializer configured to receive serial data via the data interface and to convert the serial data to parallel data;

the input deserializer configurable to operate in a selected one of a Single Data Rate mode and a Double Data Rate mode; and the input deserializer configured with a single serial chain of registers in an input stage to convert the serial data to the parallel data in the Single Data Rate mode and configured with two serial chains of registers in the input stage to convert the serial data to the parallel data in the Double Data Rate mode;

wherein the parallel data output is greater than two bits wide for processing the parallel data in parallel; and wherein the input deserializer is configured to include:

a serial to parallel converter;

a delay chain coupled to receive the serial data, delay the serial data, and provide the delayed serial data to the serial to parallel converter; and a bitslip module coupled to the serial to parallel converter to Provide a bitslip adjustment.

* * * * *